United States Patent
Liu et al.

(10) Patent No.: US 9,059,126 B1
(45) Date of Patent: Jun. 16, 2015

(54) SEMICONDUCTOR DEVICE STRUCTURE AND METHOD OF MANUFACTURING THE SAME

(71) Applicant: TAIWAN SEMICONDUCTOR MANUFACTURING CO., LTD., Hsin-Chu (TW)

(72) Inventors: Chien-Hsuan Liu, Tainan (TW); Chao-Chi Chen, Tainan (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 14/139,514

(22) Filed: Dec. 23, 2013

(51) Int. Cl.
| | |
|---|---|
| *H01L 27/088* | (2006.01) |
| *H01L 23/367* | (2006.01) |
| *H01L 49/02* | (2006.01) |
| *H01L 29/06* | (2006.01) |
| *H01L 23/373* | (2006.01) |
| *H01L 21/02* | (2006.01) |
| *H01L 21/324* | (2006.01) |
| *H01L 21/8234* | (2006.01) |

(52) U.S. Cl.
CPC ............ *H01L 23/367* (2013.01); *H01L 27/088* (2013.01); *H01L 28/20* (2013.01); *H01L 29/0649* (2013.01); *H01L 23/3731* (2013.01); *H01L 21/02164* (2013.01); *H01L 21/0217* (2013.01); *H01L 21/324* (2013.01); *H01L 21/823481* (2013.01)

(58) Field of Classification Search
CPC . H01L 27/0211; H01L 23/544; H01L 21/762; H01L 21/324; H01L 21/76224
USPC .................................. 257/392, 536; 438/778
See application file for complete search history.

(56) References Cited

U.S. PATENT DOCUMENTS

| | | | |
|---|---|---|---|
| 2008/0203540 A1* | 8/2008 | Anderson et al. | 257/629 |
| 2009/0146310 A1* | 6/2009 | Ohno et al. | 257/773 |

* cited by examiner

*Primary Examiner* — Trung Q Dang
(74) *Attorney, Agent, or Firm* — Birch, Stewart, Kolasch & Birch, LLP

(57) ABSTRACT

Embodiments of mechanisms for forming a semiconductor device structure are provided. The semiconductor device structure includes a semiconductor substrate having a first device region and a second device region. The semiconductor device structure further includes first devices in the first device region and second devices in the second device region. The semiconductor device structure also includes a first annular structure continuously surrounding the first device region and a second annular structure continuously surrounding the second device region. The first annular structure has a first thermal diffusion coefficient less than a second thermal diffusion coefficient of the second annular structure.

20 Claims, 30 Drawing Sheets

SEMICONDUCTOR DEVICE STRUCTURE AND METHOD OF MANUFACTURING THE SAME

BACKGROUND

The semiconductor integrated circuit (IC) industry has experienced rapid growth. Technological advances in IC materials and design have produced generations of ICs. Each generation has smaller and more complex circuits than the previous generation. However, these advances have increased the complexity of processing and manufacturing ICs.

In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs. However, since the number of devices per chip area continues to increase, fabrication processes continue to become more difficult to perform.

BRIEF DESCRIPTION OF THE DRAWINGS

For a more complete understanding of the embodiments, and the advantages thereof, reference is now made to the following descriptions taken in conjunction with the accompanying drawings.

DETAILED DESCRIPTION OF THE ILLUSTRATIVE EMBODIMENTS

The making and using of the embodiments of the disclosure are discussed in detail below. It should be appreciated, however, that the embodiments can be embodied in a wide variety of specific contexts. The specific embodiments discussed are merely illustrative, and do not limit the scope of the disclosure.

It is to be understood that the following disclosure provides many different embodiments, or examples, for implementing different features of the disclosure. Specific examples of components and arrangements are described below to simplify the present disclosure. These are, of course, merely examples and are not intended to be limiting. Moreover, the performance of a first process before a second process in the description that follows may include embodiments in which the second process is performed immediately after the first process, and may also include embodiments in which additional processes may be performed between the first and second processes. Various features may be arbitrarily drawn in different scales for the sake of simplicity and clarity. Furthermore, the formation of a first feature over or on a second feature in the description that follows include embodiments in which the first and second features are formed in direct contact, and may also include embodiments in which additional features may be formed between the first and second features, such that the first and second features may not be in direct contact.

Some variations of the embodiments are described. Throughout the various views and illustrative embodiments, like reference numbers are used to designate like elements. It is understood that additional operations can be provided before, during, and after the method, and some of the operations described can be replaced or eliminated for other embodiments of the method.

FIGS. 1A-1F are top views of various stages of a process for forming a semiconductor device structure 100, in accordance with some embodiments. FIGS. 2A-2F are cross-sectional views of the structures along sectional lines 2A-2A, 2B-2B, 2C-2C, 2D-2D, 2E-2E and 2F-2F shown in FIGS. 1A-1F, respectively, in accordance with some embodiments.

Figure 1A:
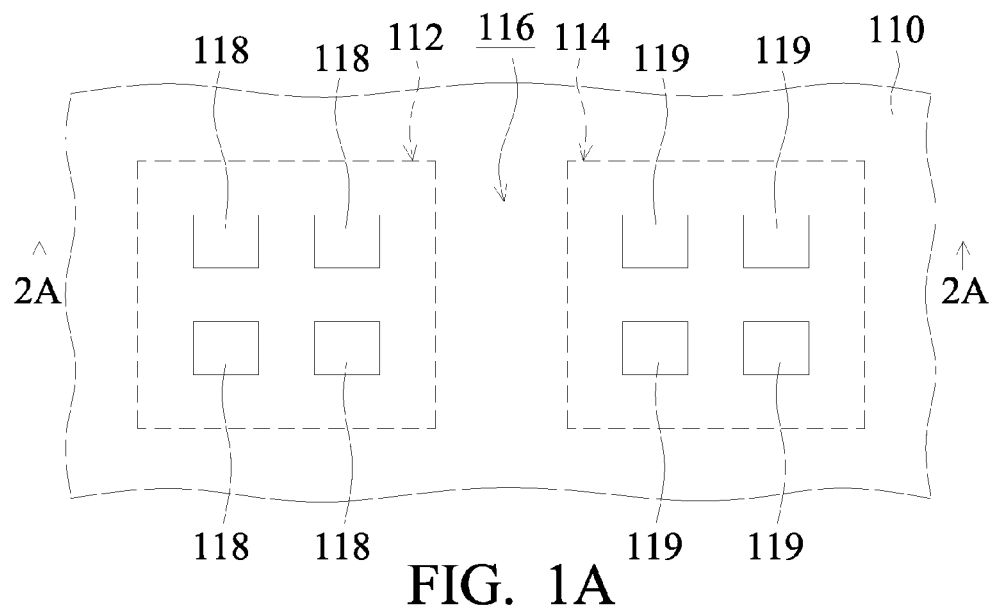
FIGS. 1A-1F are top views of various stages of a process for forming a semiconductor device structure, in accordance with some embodiments.
Figure 2A:
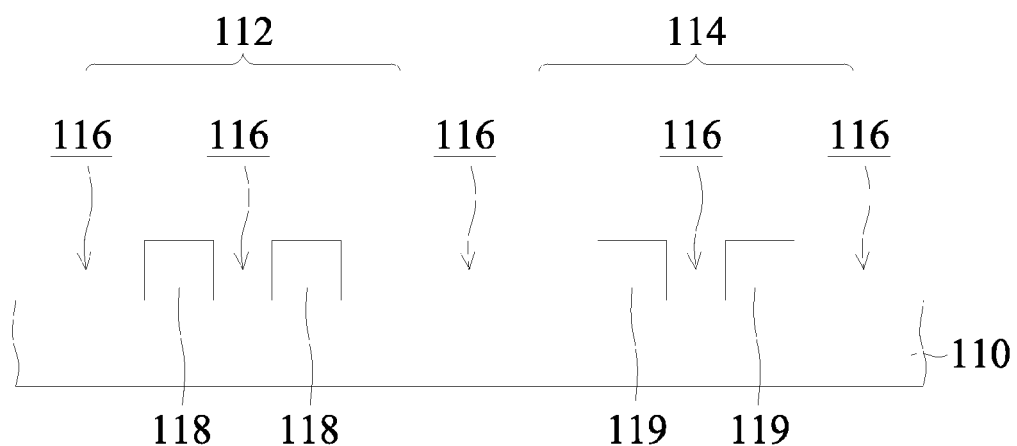
FIGS. 2A-2F are cross-sectional views of the structures along sectional lines 2A-2A, 2B-2B, 2C-2C, 2D-2D, 2E-2E and 2F-2F shown in FIGS. 1A-1F, respectively, in accordance with some embodiments.

As shown in FIGS. 1A and 2A, a semiconductor substrate 110 is provided, in accordance with some embodiments. The semiconductor substrate 110 may be a semiconductor wafer (such as a silicon wafer) or a portion of a semiconductor wafer.

In some embodiments, the semiconductor substrate 110 is made of an elementary semiconductor material including silicon or germanium in a single crystal, polycrystal, or amorphous structure. In some other embodiments, the semiconductor substrate 110 is made of a compound semiconductor such as silicon carbide, gallium arsenide, gallium phosphide, indium phosphide, indium arsenide, an alloy semiconductor such as SiGe, or GaAsP, or a combination thereof. The semiconductor substrate 110 may also include multi-layer semiconductors, semiconductor on insulator (SOI) (such as silicon on insulator or germanium on insulator), or a combination thereof.

The semiconductor substrate 110 has a first device region 112 and a second device region 114, in accordance with some embodiments. An etching process is performed to form a trench 116 in the semiconductor substrate 110, in accordance with some embodiments. The trench 116 defines first active regions 118 in the first device region 112 and second active regions 119 in the second device region 114, in accordance with some embodiments.

Figure 1B:
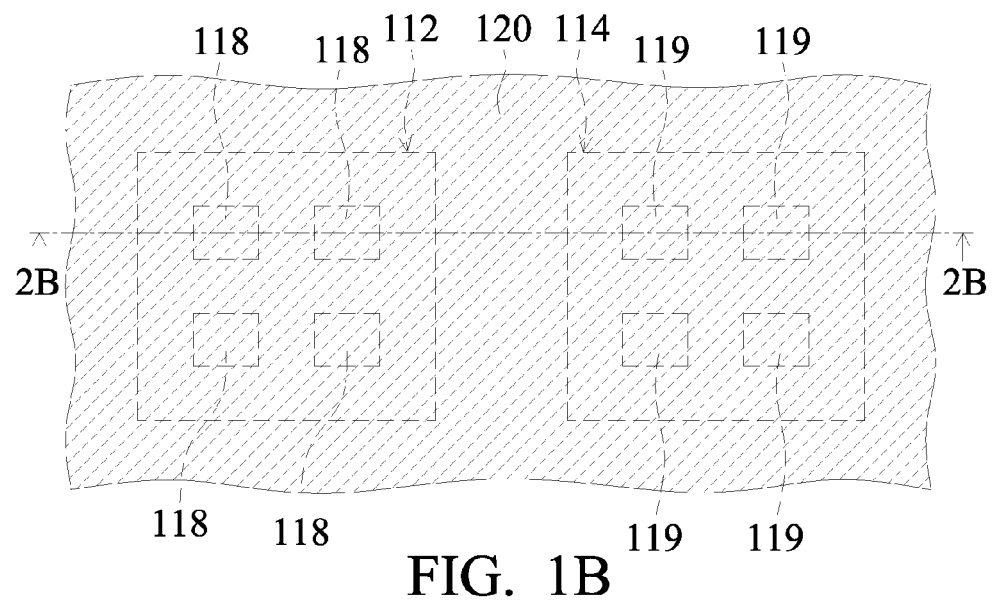
Figure 2B:
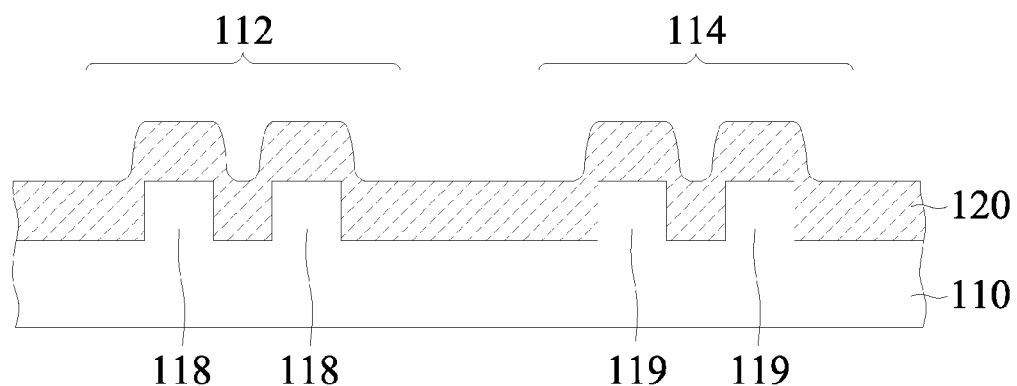

As shown in FIGS. 1B and 2B, a first material layer 120 is deposited on the semiconductor substrate 110, in accordance with some embodiments. The first material layer 120 includes materials with a low thermal diffusion coefficient, in accordance with some embodiments.

The thermal diffusion coefficient is defined as the ability of a material to conduct thermal energy relative to its ability to store thermal energy. That is, in a material with a high thermal diffusion coefficient, heat moves rapidly through it because the material conducts heat quickly relative to its volumetric heat capacity. Similarly, in a material with a low thermal diffusion coefficient, heat moves slowly through it because the material conducts heat slowly relative to its volumetric heat capacity.

In some embodiments, the first material layer 120 includes semiconductor nitride (such as silicon nitride). The deposition method of the first material layer 120 includes a chemical vapor deposition process (CVD process), a physical vapor deposition process (PVD process) or other suitable deposition processes, in accordance with some embodiments.

Figure 1C:
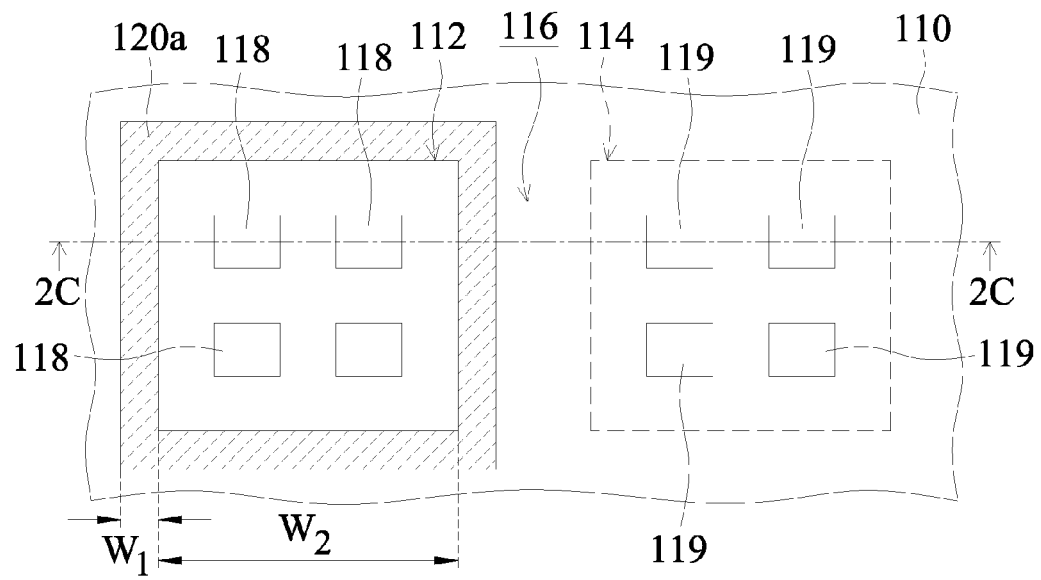
Figure 2C:
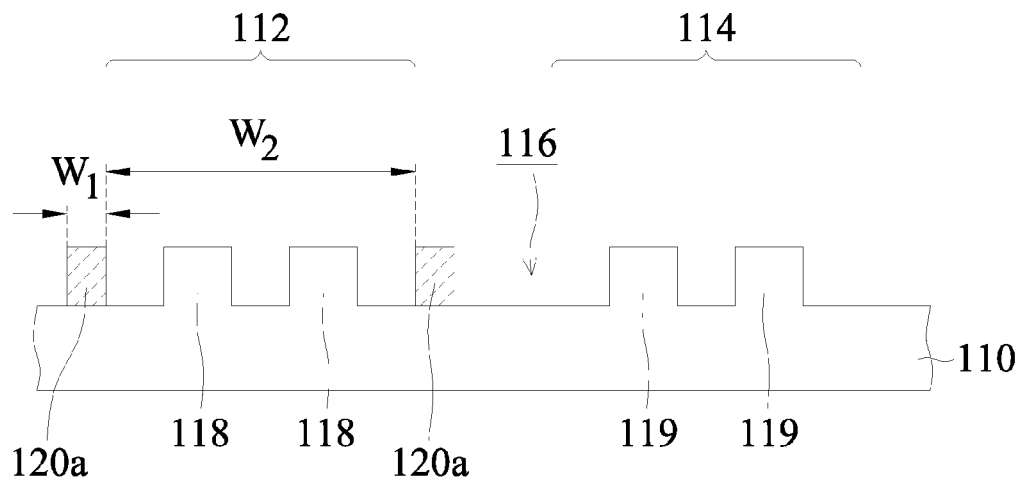

As shown in FIGS. 1C and 2C, the first material layer 120 is patterned into a first annular structure 120a in the trench 116, in accordance with some embodiments. The first annular structure 120a continuously surrounds the first device region 112, in accordance with some embodiments. The patterning method of the first material layer 120 includes a photolithography process and an etching process, in accordance with some embodiments.

In some embodiments, the first annular structure 120a has a width (linewidth) W1 ranging from about 15 µm to about 150 µm. In some embodiments, the width W1 ranges from about 50 µm to about 70 µm. In some embodiments, the first device region 112 has a width W2 ranging from about 10 µm to about 100 µm. In some embodiments, a ratio of the width W1 of the first annular structure 120a to the width W2 of the first device region 112 ranges from about 0.15 to about 1.5.

Figure 1D:
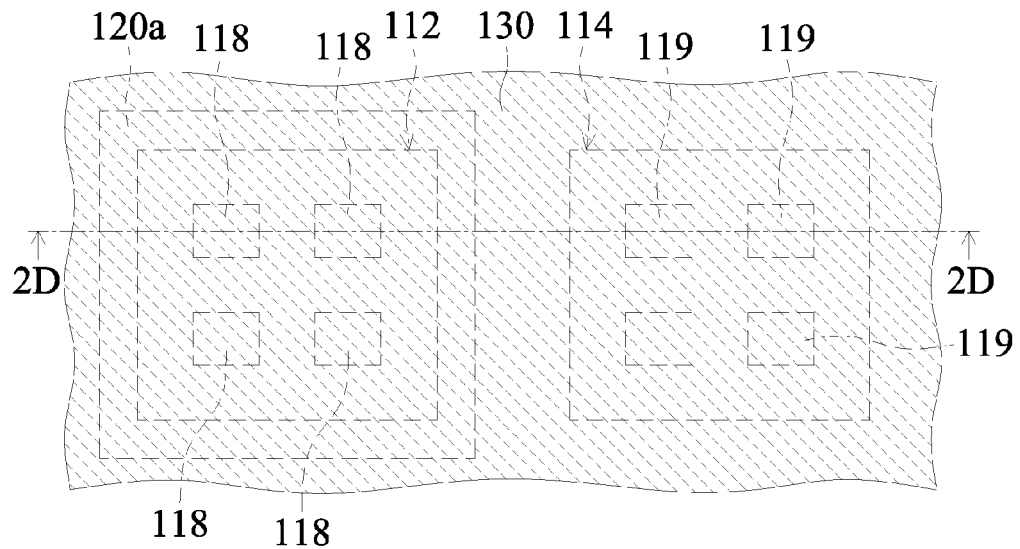
Figure 2D:
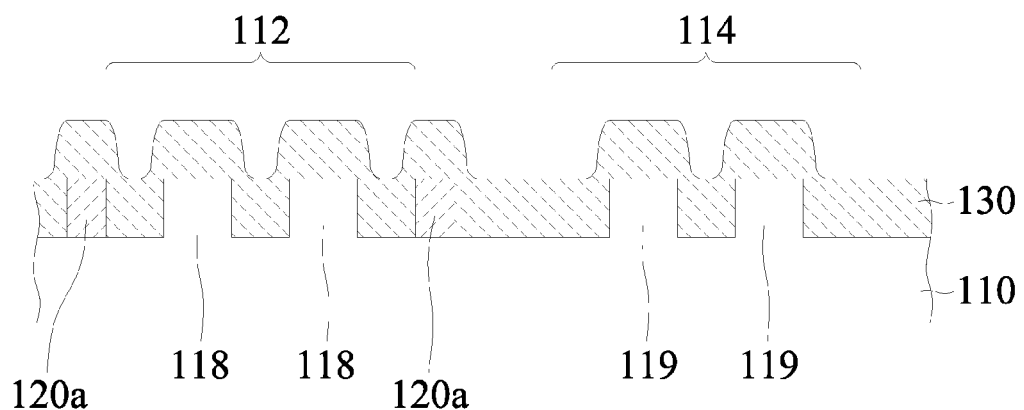

As shown in FIGS. 1D and 2D, a second material layer 130 is deposited on the semiconductor substrate 110, in accordance with some embodiments. The second material layer 130 has a thermal diffusion coefficient higher than that of the first annular structure 120a, in accordance with some embodiments.

The second material layer 130 includes semiconductor, metal or other suitable materials, in accordance with some embodiments. For example, the second material layer 130 includes silicon germanium, copper, gold, silver or aluminum. The deposition method of the second material layer 130 includes a CVD process, a PVD process or another suitable deposition process, in accordance with some embodiments.

Figure 1E:
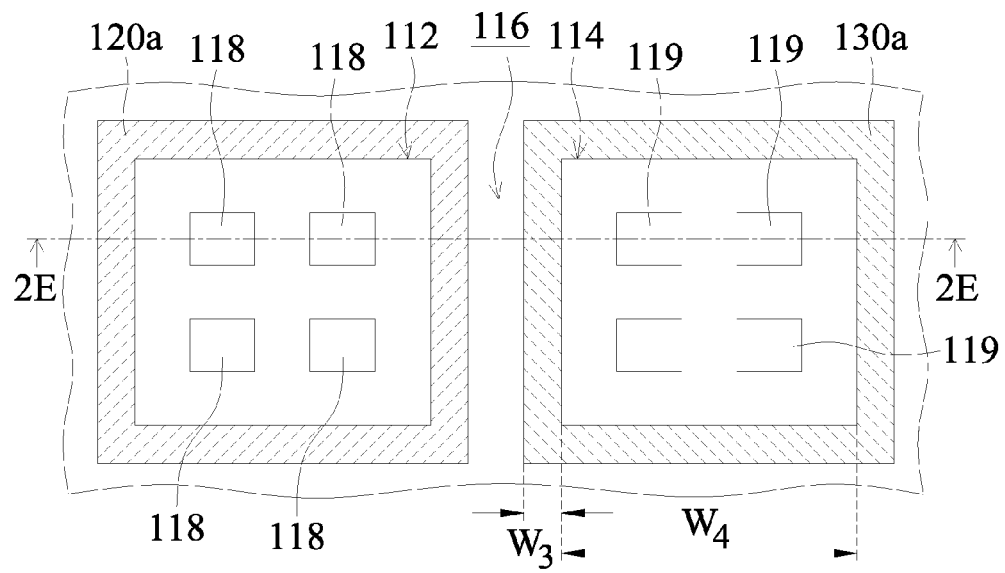
Figure 2E:
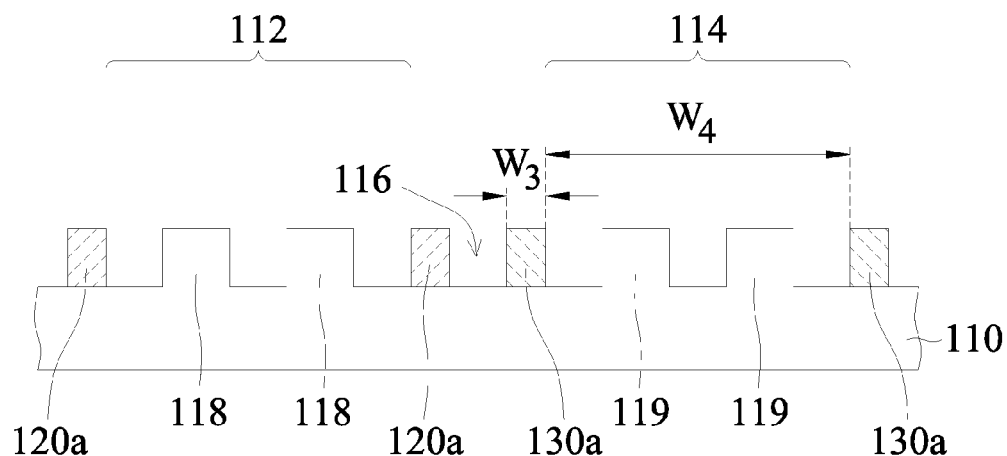

As shown in FIGS. 1E and 2E, the second material layer 130 is patterned into a second annular structure 130a in the trench 116, in accordance with some embodiments. The second annular structure 130a continuously surrounds the second device region 114, in accordance with some embodiments. The patterning method of the second material layer 130 includes a photolithography process and an etching process, in accordance with some embodiments.

In some embodiments, the second annular structure 130a has a width (linewidth) W3 ranging from about 15 µm to about 150 µm. In some embodiments, the width W3 ranges from about 50 µm to about 70 µm. In some embodiments, the second device region 114 has a width W4 ranging from about 10 µm to about 100 µm. In some embodiments, a ratio of the width W3 of the second annular structure 130a to the width W4 of the second device region 114 ranges from about 0.15 to about 1.5.

The order of forming the first annular structure 120a and the second annular structure 130a is not limited to the above description. In some other embodiments, the second annular structure 130a is formed first, and then the first annular structure 120a is formed.

Figure 1F:
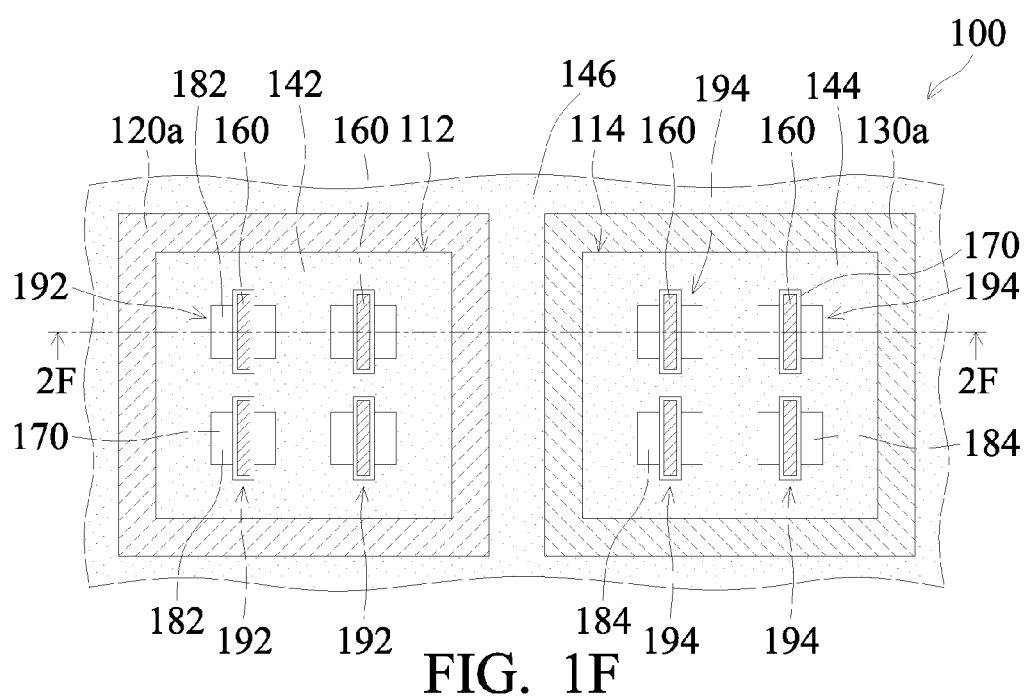
Figure 2F:
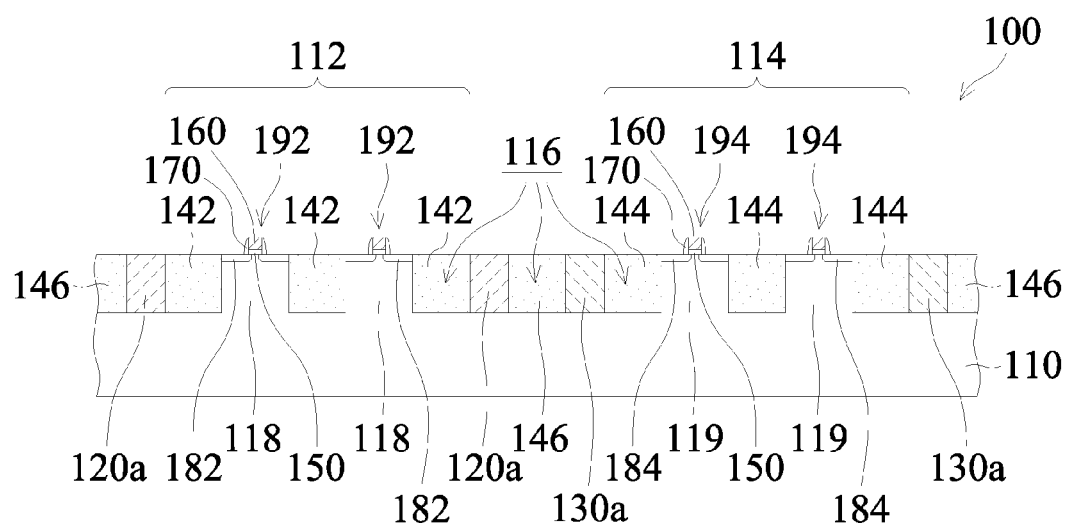

As shown in FIGS. 1F and 2F, isolation structures 142, 144 and 146 are formed in the trench 116 unoccupied by the first annular structure 120a and the second annular structure 130a, in accordance with some embodiments. The isolation structures 142, 144 and 146 are configured to electrically isolate neighboring devices (e.g. transistors) from one another.

The isolation structure 142 surrounds the active regions 118, and a portion of the isolation structure 142 is between the active regions 118 and the first annular structure 120a, in accordance with some embodiments. The isolation structure 144 surrounds the active regions 119, and a portion of the isolation structure 144 is between the active regions 119 and the second annular structure 130a, in accordance with some embodiments. A portion of the isolation structure 146 is between the first annular structure 120a and the second annular structure 130a, in accordance with some embodiments.

The isolation structures 142, 144 and 146 are made of a dielectric material, such as silicon oxide, silicon nitride, silicon oxynitride, fluoride-doped silicate glass (FSG), a low-K dielectric material, other suitable materials, or combinations thereof, in accordance with some embodiments. The isolation structures 142, 144 and 146 are formed by using an isolation technology, such as local oxidation of semiconductor (LOCOS), shallow trench isolation (STI), or the like, in accordance with some embodiments.

In some embodiments, the formation of the isolation structures 142, 144 and 146 includes depositing a dielectric material layer (not shown) on the semiconductor substrate 110 to fill the trench 116 and removing the dielectric material layer outside of the trench 116. The deposition process of the dielectric material layer includes a CVD process or other suitable processes, in accordance with some embodiments. The removal process of the dielectric material layer includes a chemical mechanical polishing (CMP) process or other suitable processes, in accordance with some embodiments.

Thereafter, gate dielectric layers 150 and gates 160 are formed over the active regions 118 and 119 of the semiconductor substrate 110, in accordance with some embodiments. The gate dielectric layers 150 are made of silicon oxide, silicon oxynitride, a high dielectric constant material (high-k material), or a combination thereof, in accordance with some embodiments. The method of forming the gate dielectric layers 150 includes a CVD process, a PVD process or other suitable processes, in accordance with some embodiments.

The gates 160 are made of polysilicon or other suitable materials, in accordance with some embodiments. The method of forming the gates 160 includes a CVD process, a PVD process or other suitable processes, in accordance with some embodiments. Spacer layers 170 are formed on sidewalls of the gate dielectric layers 150 and the gates 160. The spacer layers 170 include insulating materials, such as silicon oxides or silicon nitrides.

Thereafter, an ion implantation process is performed by using the gates 160 as masks to form doped regions 182 and 184 in the first active regions 118 and the second active regions 119, respectively, in accordance with some embodiments. Afterwards, an annealing process is performed to activate the implanted dopants (such as n-type dopants or p-type dopants) in the doped regions 182 and 184, in accordance with some embodiments. The term "activate" indicates that the dopants become electrically active by moving to the proper sites in the semiconductor lattice. In some embodiments, the annealing process includes a flash-lamp annealing process, a rapid thermal annealing (RTA) process, a laser annealing process or other suitable annealing process.

In some embodiments, the doped regions 182 and 184 are configured to be source regions and drain regions. In this step, first transistors 192 in the first device region 112 and second transistors 194 in the second device region 114 are substantially formed. It should be noted that although the number of first transistors 192 and the number of second transistors 194 are both four, the invention is not limited thereto. That is to say, there may be dozens, hundreds or thousands of the first transistors 192 or the second transistors 194.

Each of the first transistor 192 includes a gate dielectric layer 150, a gate 160 thereon, a spacer layer 170 on the sidewalls of the gate dielectric layer 150 and the gate 160 and two doped regions 182 adjacent to the gate 160 in the first device region 112. Each of the second transistor 194 includes a gate dielectric layer 150, a gate 160 thereon, a spacer layer 170 on the sidewalls of the gate dielectric layer 150 and the gate 160 and two doped regions 184 adjacent to the gate 160 in the second device region 114.

In some embodiments, if the implanted dopants in the doped regions are activated uniformly, the resistance of the doped regions is decreased, and the threshold voltage of the transistor having the doped regions is decreased as well. Similarly, if the implanted dopants in the doped regions are activated non-uniformly, the resistance of the doped regions is high, and the threshold voltage of the transistor having the doped regions is high as well. The uniformity of the dopant activation depends on the processing temperature and the processing time of the annealing process. If the processing temperature is higher and/or the processing time is longer, the uniformity of the dopant activation is higher.

In some embodiments, the first annular structure 120a has a thermal diffusion coefficient less than that of the second annular structure 130a. Therefore, after the annealing process, the first annular structure 120a may maintain a higher temperature than the second annular structure 130a. Hence, the first device region 112 surrounded by the first annular structure 120a may maintain a higher temperature than the second device region 114 surrounded by the second annular structure 130a. The first device region 112 is referred to as a hot zone, and the second device region 114 is referred to as a cold zone, in accordance with some embodiments.

Therefore, the dopants in the first device region 112 (i.e., the hot zone) are activated more uniformly than the dopants in the second device region 114 (i.e., the cold zone). As a result, the threshold voltage of the first transistors 192 in the first device region 112 is lower than the threshold voltage of the second transistors 194 in the second device region 114.

Thereby, after the same annealing process, the transistors on the same wafer (or the same chip) may have different threshold voltages to achieve different functions. In some embodiments, the transistors with a lower threshold voltage may be used in a central processing unit (CPU), and the transistors with a higher threshold voltage may be used as I/O transistors.

Figure 3A:
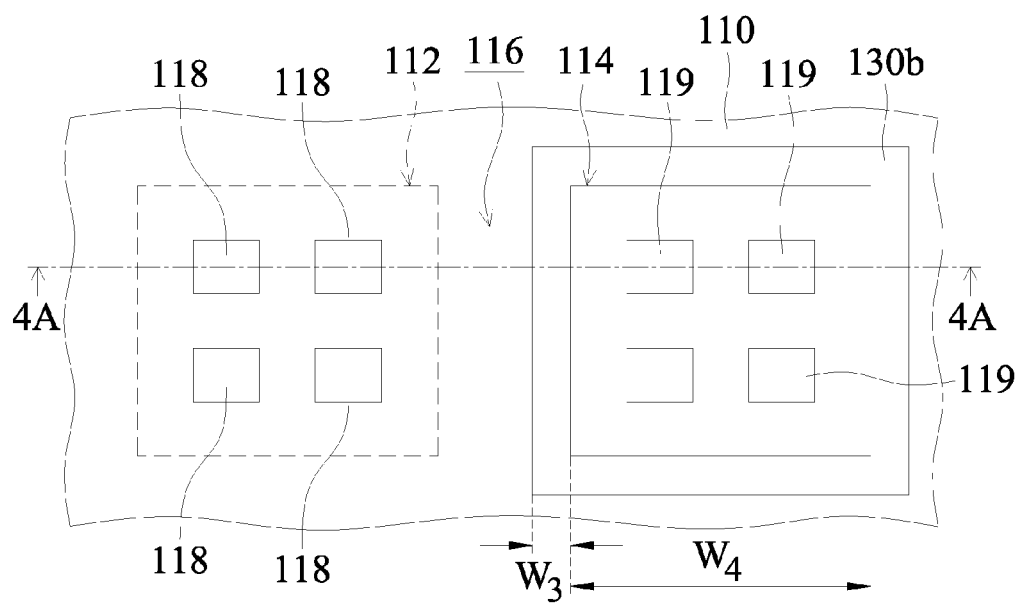
FIGS. 3A-3B are top views of various stages of a process for forming a semiconductor device structure, in accordance with some embodiments.
Figure 3B:
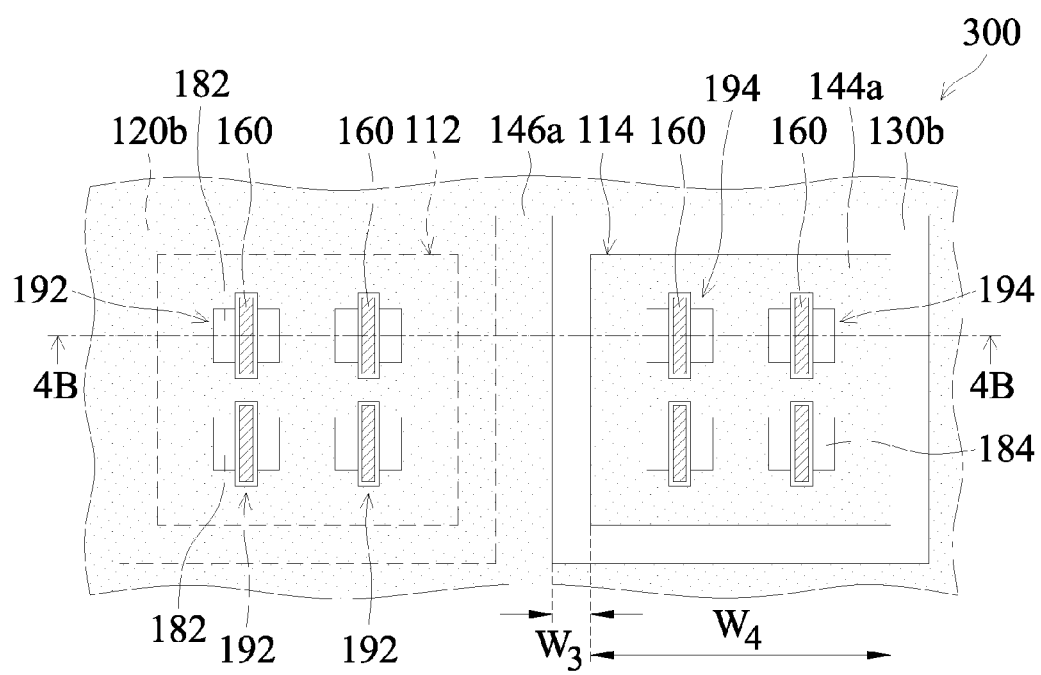
Figure 4A:
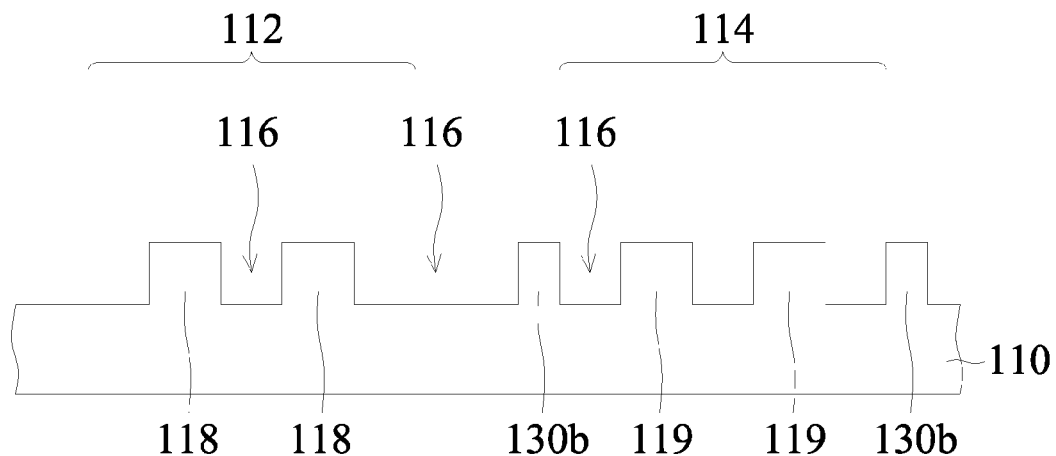
FIGS. 4A-4B are cross-sectional views of the structures along sectional lines 4A-4A and 4B-4B shown in FIGS. 3A-3B, respectively, in accordance with some embodiments.
Figure 4B:
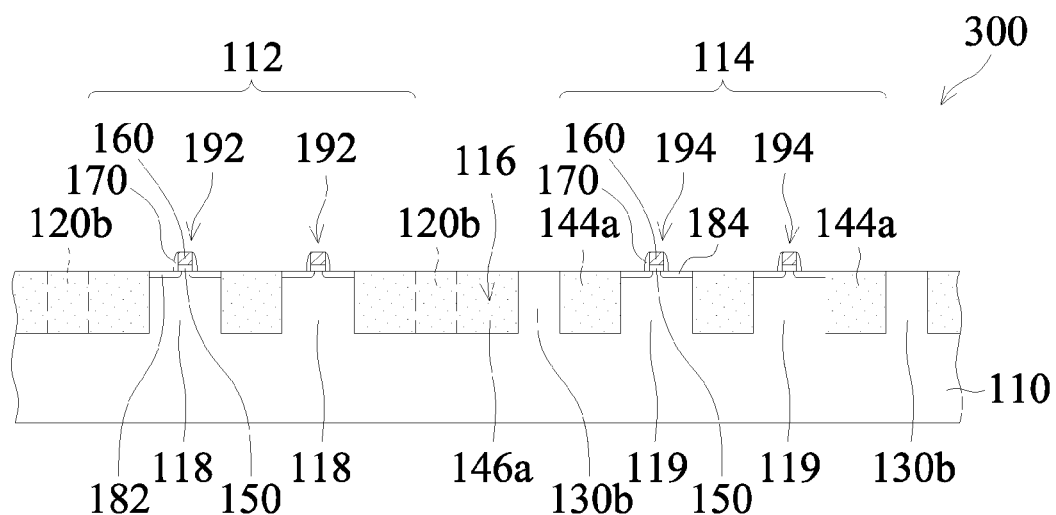

FIGS. 3A-3B are top views of various stages of a process for forming a semiconductor device structure 300, in accordance with some embodiments. FIGS. 4A-4B are cross-sectional views of the structures along sectional lines 4A-4A and 4B-4B shown in FIGS. 3A-3B, respectively, in accordance with some embodiments.

As shown in FIGS. 3A and 4A, a semiconductor substrate 110 is provided, in accordance with some embodiments. The semiconductor substrate 110 has a first device region 112 and a second device region 114, in accordance with some embodiments. An etching process is performed to form a trench 116 in the semiconductor substrate 110, in accordance with some embodiments. The trench 116 defines first active regions 118 in the first device region 112, second active regions 119 in the second device region 114, and a second annular structure 130b continuously surrounds the second device region 114, in accordance with some embodiments.

In some embodiments, the second annular structure 130b has a width (linewidth) W3 ranging from about 15 μm to about 150 μm. In some embodiments, the width W3 ranges from about 50 μm to about 70 μm. In some embodiments, the second device region 114 has a width W4 ranging from about 10 μm to about 100 μm. In some embodiments, a ratio of the width W3 of the second annular structure 130b to the width W4 of the second device region 114 ranges from about 0.15 to about 1.5.

As shown in FIGS. 3B and 4B, isolation structures 144a and 146a are formed in the trench 116, in accordance with some embodiments. The isolation structures 144a and 146a are configured to electrically isolate neighboring devices (e.g. transistors) from one another, in accordance with some embodiments. The isolation structure 144a is surrounded by the second annular structure 130b, in accordance with some embodiments.

Compared with the embodiment of FIGS. 1A-1F, the embodiment of FIGS. 3A-3B uses the material of the semiconductor substrate 110 to form the second annular structure 130b. Furthermore, the embodiment of FIGS. 3A-3B uses the material of the isolation structures 144a and 146a to form the first annular structure 120b (shown as the dotted line in FIGS. 3B and 4B).

In some embodiments, the isolation structures 144a and 146a have a thermal diffusion coefficient less than that of the semiconductor substrate 110. That is, the first annular structure 120b has a thermal diffusion coefficient less than that of the second annular structure 130b. In some embodiments, the first annular structure 120b includes semiconductor oxides (such as silicon oxide). In some embodiments, the second annular structure 130b includes semiconductors (such as silicon).

Thereafter, gate dielectric layers 150 and gates 160 are formed over the active regions 118 and 119 of the semiconductor substrate 110, in accordance with some embodiments. Spacer layers 170 are formed on sidewalls of the gate dielectric layers 150 and the gates 160.

Thereafter, an ion implantation process is performed by using the gates 160 as masks to form doped regions 182 and 184 in the first active regions 118 and the second active regions 119, respectively, in accordance with some embodiments. Afterwards, an annealing process is performed to activate the implanted dopants (such as n-type dopants or p-type dopants) in the doped regions 182 and 184, in accordance with some embodiments.

In some embodiments, the doped regions 182 and 184 are configured to be source regions and drain regions. In this step, first transistors 192 in the first device region 112 and second transistors 194 in the second device region 114 are substantially formed. In some embodiments, the threshold voltage of the first transistors 192 surrounded by the first annular structure 120b is lower than that of the second transistors 194 surrounded by the second annular structure 130b.

Figure 5:
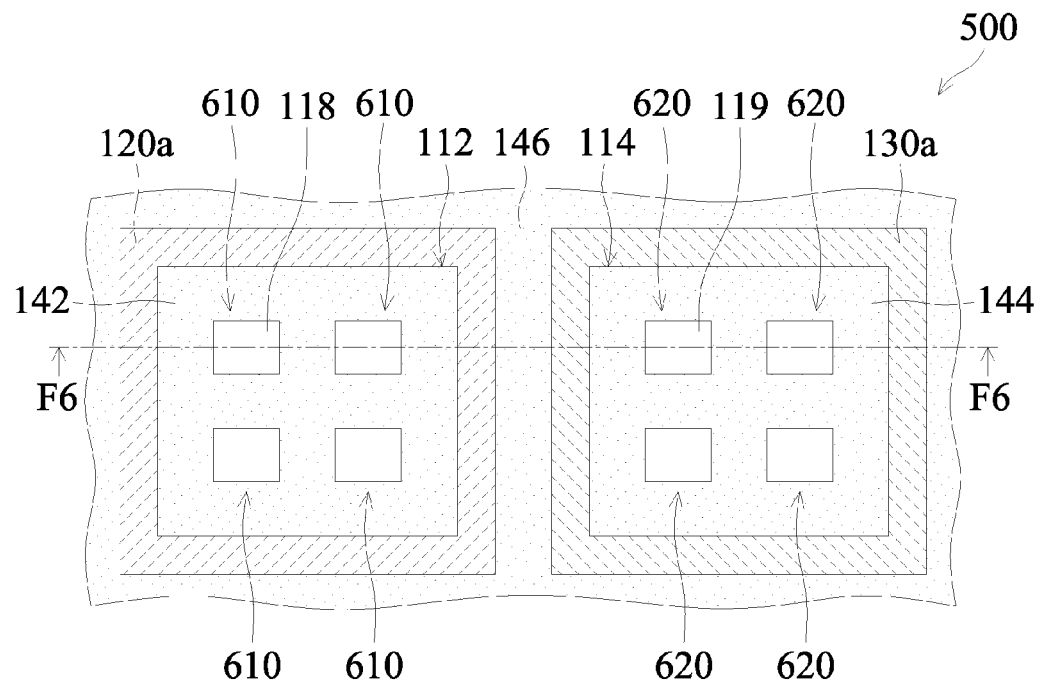
FIG. 5 is a top view of a semiconductor device structure, in accordance with some embodiments.
Figure 6:
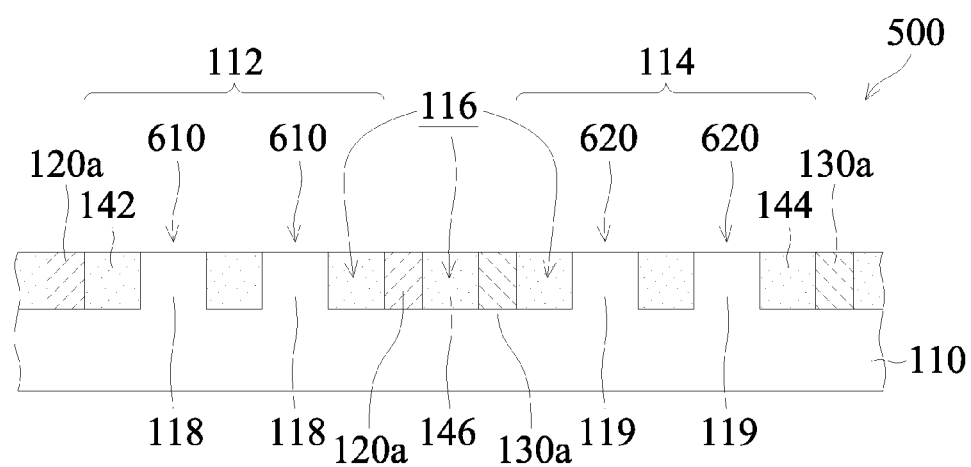
FIG. 6 is a cross-sectional view of the structure along a sectional line F6-F6 shown in FIG. 5, respectively, in accordance with some embodiments.

FIG. 5 is a top view of a semiconductor device structure 500, in accordance with some embodiments. FIG. 6 is a cross-sectional view of the structure along a sectional line F6-F6 shown in FIG. 5, respectively, in accordance with some embodiments.

As shown in FIGS. 5 and 6, after the step of FIGS. 1E and 2E, isolation structures 142, 144 and 146 are formed in the trench 116 unoccupied by the first annular structure 120a and the second annular structure 130a, in accordance with some embodiments. In some embodiments, the first annular structure 120a includes semiconductor nitride (such as silicon nitride). The second annular structure 130a includes semiconductor or metal, in accordance with some embodiments. For example, the second annular structure 130a includes silicon germanium, copper, gold, silver or aluminum.

Thereafter, an ion implantation process is performed on the first active regions 118 and the second active regions 119. Afterwards, an annealing process is performed to activate the implanted dopants (such as n-type dopants or p-type dopants) in the first active regions 118 and the second active regions 119, in accordance with some embodiments. In this step, first resistors 610 in the first active regions 118 and second resistors 620 in the second active regions 119 are substantially formed.

In some embodiments, the first annular structure 120a has a thermal diffusion coefficient less than that of the second annular structure 130a. Therefore, after the annealing process, the first annular structure 120a may maintain a higher temperature than the second annular structure 130a. Hence, the first device region 112 surrounded by the first annular structure 120a may maintain a higher temperature than the second device region 114 surrounded by the second annular structure 130a.

Therefore, the dopants in the first device region 112 (i.e., the hot zone) are activated more uniformly than the dopants in the second device region 114 (i.e., the cold zone). As a result, the resistance of the first resistors 610 in the first device region 112 is lower than the resistance of the second resistors 620 in the second device region 114. Thereby, after the same annealing process, the resistors on the same wafer (or the same chip) may have different resistances to achieve different functions.

Figure 7:
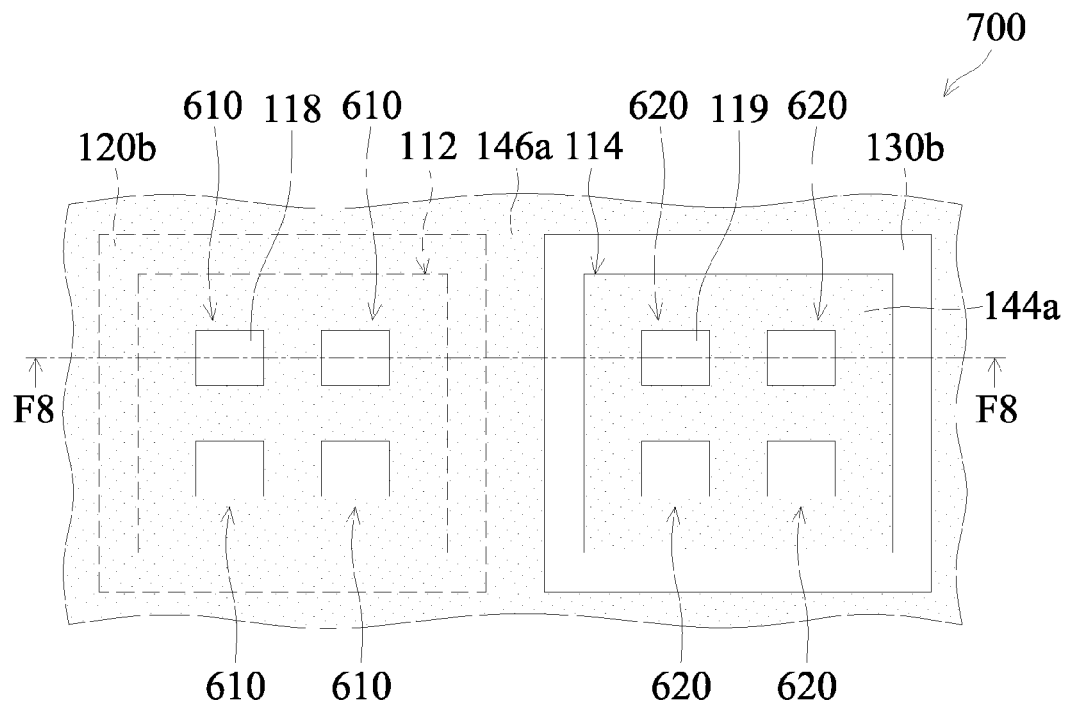
FIG. 7 is a top view of a semiconductor device structure, in accordance with some embodiments.
Figure 8:
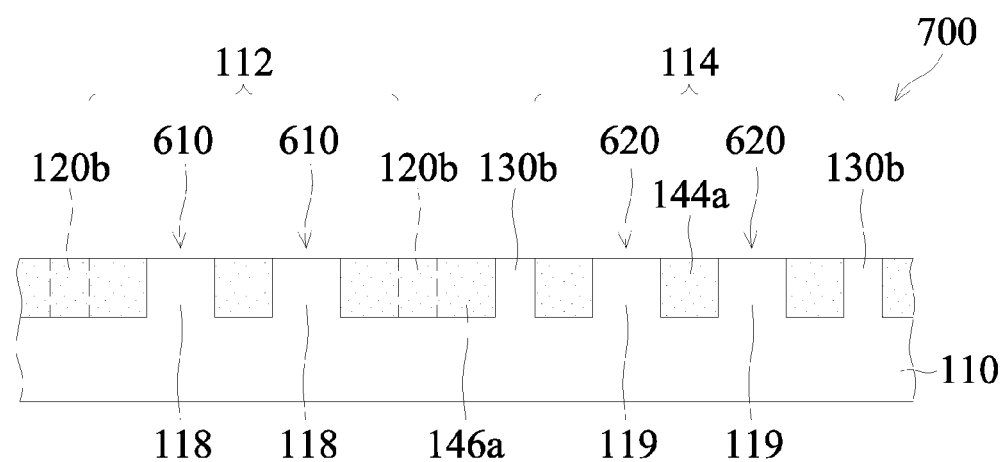
FIG. 8 is a cross-sectional view of the structure along a sectional line F8-F8 shown in FIG. 7, respectively, in accordance with some embodiments.

FIG. 7 is a top view of a semiconductor device structure 700, in accordance with some embodiments. FIG. 8 is a cross-sectional view of the structure along a sectional line F8-F8 shown in FIG. 7, respectively, in accordance with some embodiments.

It should be noted that the embodiment of FIGS. 7 and 8 is similar to the embodiment of FIGS. 5 and 6 except that the first annular structure 120b of the embodiment of FIGS. 7 and 8 has the same material as the isolation structures 144a and 146a, and the second annular structure 130b has the same material as the semiconductor substrate 110.

In some embodiments, the first annular structure 120b and the isolation structures 144a and 146a are formed in the same process, and the second annular structure 130b and the first active regions 118 and the second active regions 119 are formed in the same process.

In some embodiments, the first annular structure 120b has a thermal diffusion coefficient less than that of the second annular structure 130b. In some embodiments, the first annular structure 120b (or the isolation structures 144a and 146a) includes semiconductor oxides (such as silicon oxide). In some embodiments, the second annular structure 130b (or the semiconductor substrate 110) includes semiconductors (such as silicon). In some embodiments, the resistance of the first resistors 610 in the first device region 112 is lower than the resistance of the second resistors 620 in the second device region 114.

Figure 9:
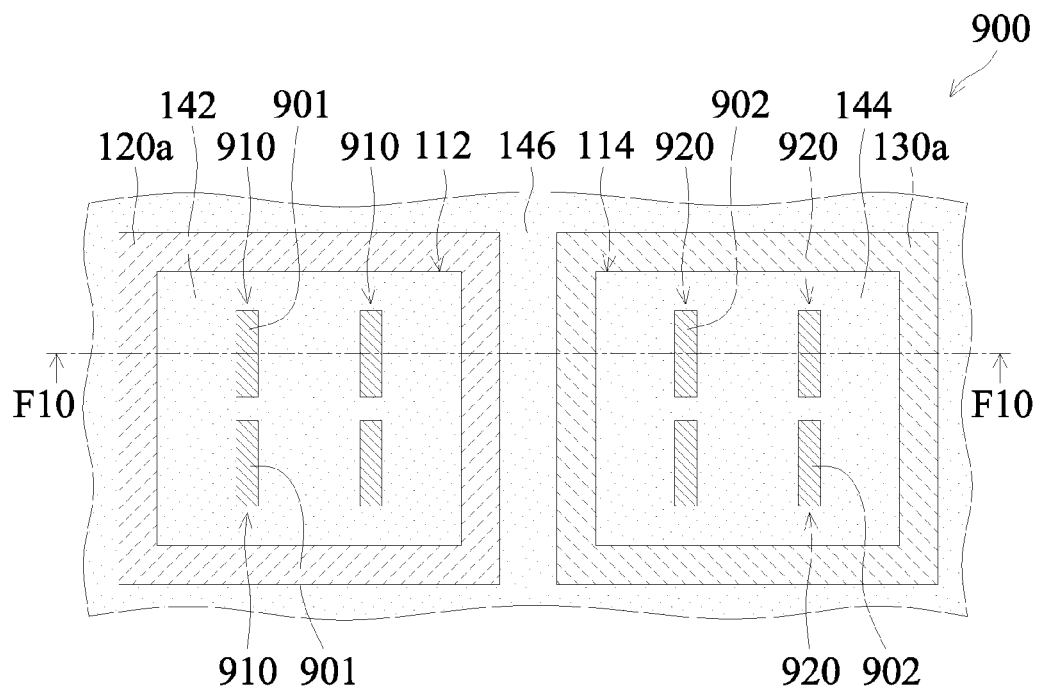
FIG. 9 is a top view of a semiconductor device structure, in accordance with some embodiments.
Figure 10:
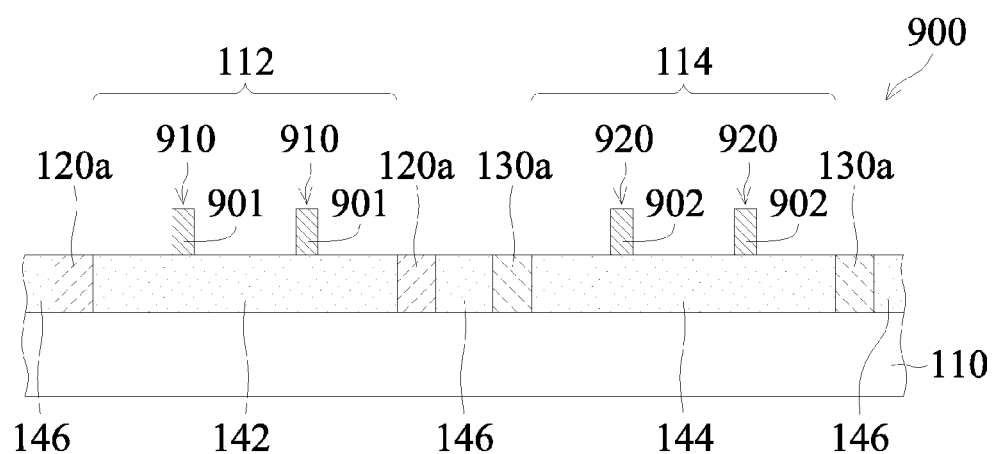
FIG. 10 is a cross-sectional view of the structure along a sectional line F10-F10 shown in FIG. 9, respectively, in accordance with some embodiments.

FIG. 9 is a top view of a semiconductor device structure 900, in accordance with some embodiments. FIG. 10 is a cross-sectional view of the structure along a sectional line F10-F10 shown in FIG. 9, respectively, in accordance with some embodiments.

It should be noted that the embodiment of FIGS. 9 and 10 is similar to the embodiment of FIGS. 5 and 6 except that first resistors 910 in the first device region 112 and second resistors 920 in the second device region 114 are located on the isolation structures 142 and 144, respectively.

In some embodiments, the first and second resistors 910 and 920 are made of semiconductor materials (such as polysilicon). In some embodiments, the method of forming the first and second resistors 910 and 920 includes depositing a semiconductor material layer (not shown) on the isolation structures 142, 144 and 146; patterning the semiconductor material layer into separated portions 901 and 902; implanting the separated portions 901 and 902 with dopants (such as n-type dopants or p-type dopants); and annealing the separated portions 901 and 902 to activate the dopants.

In some embodiments, the first annular structure 120a has a thermal diffusion coefficient less than that of the second annular structure 130a. Therefore, after the annealing process, the first annular structure 120a may maintain a higher temperature than the second annular structure 130a. Hence, the first device region 112 surrounded by the first annular structure 120a may maintain a higher temperature than the second device region 114 surrounded by the second annular structure 130a.

Therefore, the dopants in the first device region 112 (i.e., the hot zone) are activated more uniformly than the dopants in the second device region 114 (i.e., the cold zone). As a result, the resistance of the first resistors 910 in the first device region 112 is lower than the resistance of the second resistors 920 in the second device region 114.

Figure 11:
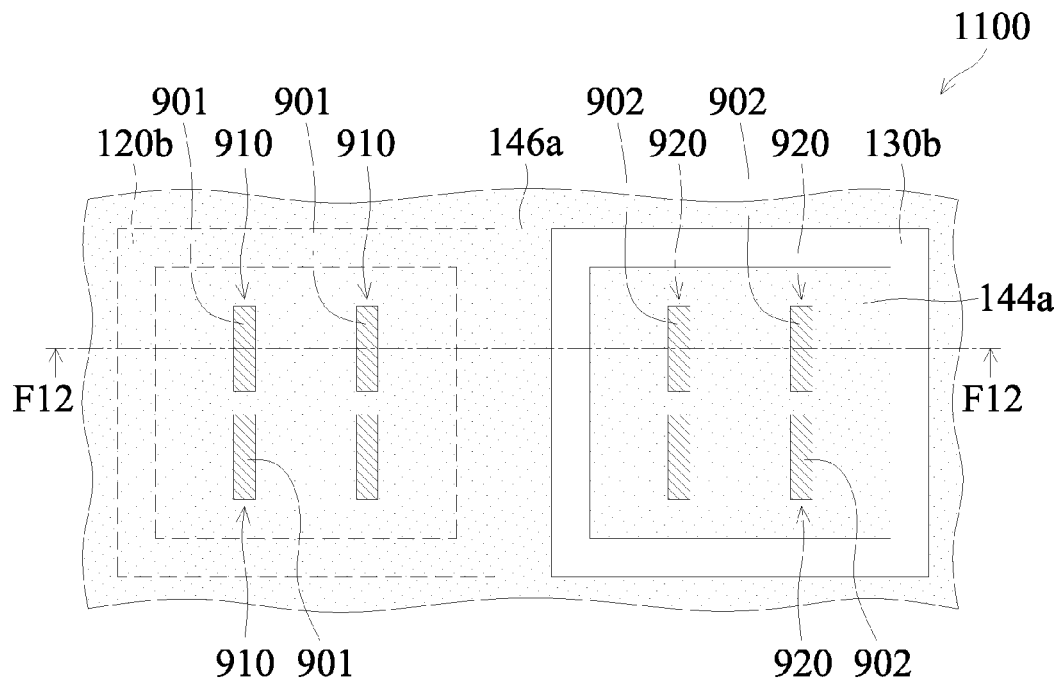
FIG. 11 is a top view of a semiconductor device structure, in accordance with some embodiments.
Figure 12:
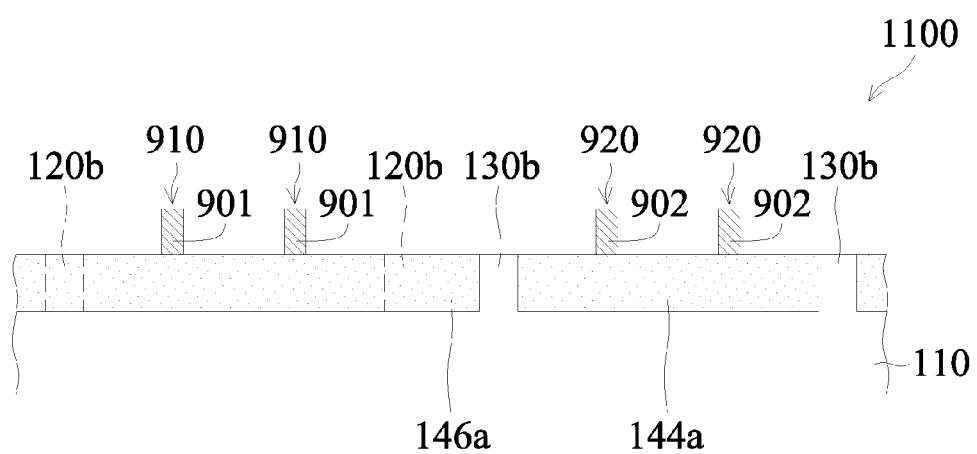
FIG. 12 is a cross-sectional view of the structure along a sectional line F12-F12 shown in FIG. 11, respectively, in accordance with some embodiments.

FIG. 11 is a top view of a semiconductor device structure 1100, in accordance with some embodiments. FIG. 12 is a cross-sectional view of the structure along a sectional line F12-F12 shown in FIG. 11, in accordance with some embodiments.

It should be noted that the semiconductor device structure 1100 of FIGS. 11 and 12 is similar to the semiconductor device structure 900 of FIG. 9. The difference between the semiconductor device structures 900 and 1100 is that the first annular structure 120b of the semiconductor device structure 1100 has the same material as the isolation structures 144a and 146a, and the second annular structure 130b has the same material as the semiconductor substrate 110. In some embodiments, the first annular structure 120b and the isolation structures 144a and 146a are formed in the same process.

In some embodiments, the first annular structure 120b has a thermal diffusion coefficient less than that of the second annular structure 130b. In some embodiments, the first annular structure 120b includes semiconductor oxides (such as silicon oxide). In some embodiments, the second annular structure 130b includes semiconductors (such as silicon). In some embodiments, the resistance of the first resistors 910 in the first device region 112 is lower than the resistance of the second resistors 920 in the second device region 114.

FIGS. 13A-13E are top views of various stages of a process for forming a semiconductor device structure 1300, in accordance with some embodiments. FIGS. 14A-14E are cross-sectional views of the structures along sectional lines 14A-14A, 14B-14B, 14C-14C, 14D-14D and 14E-14E shown in FIGS. 13A-13E, respectively, in accordance with some embodiments.

Figure 13A:
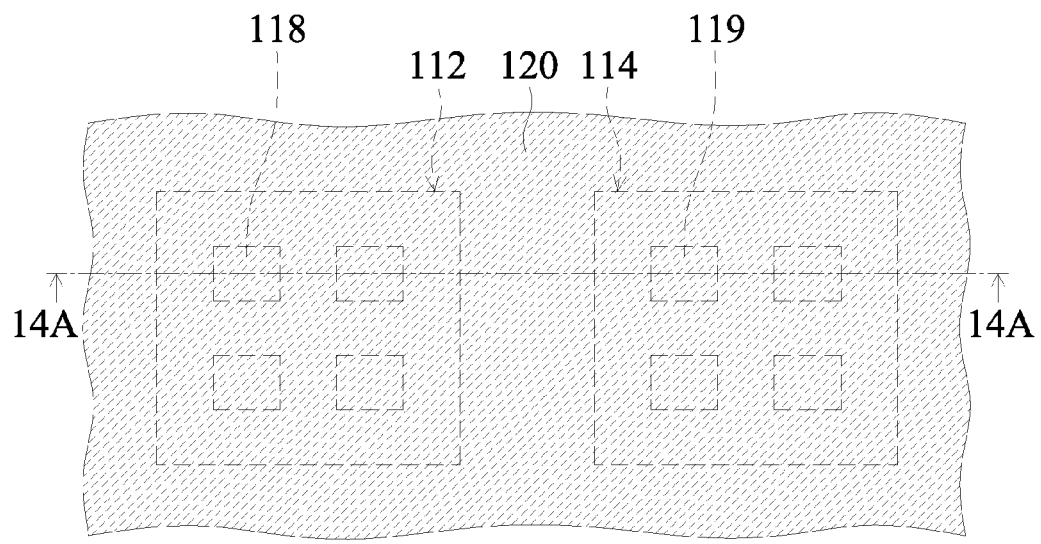
FIGS. 13A-13E are top views of various stages of a process for forming a semiconductor device structure, in accordance with some embodiments.
Figure 14A:
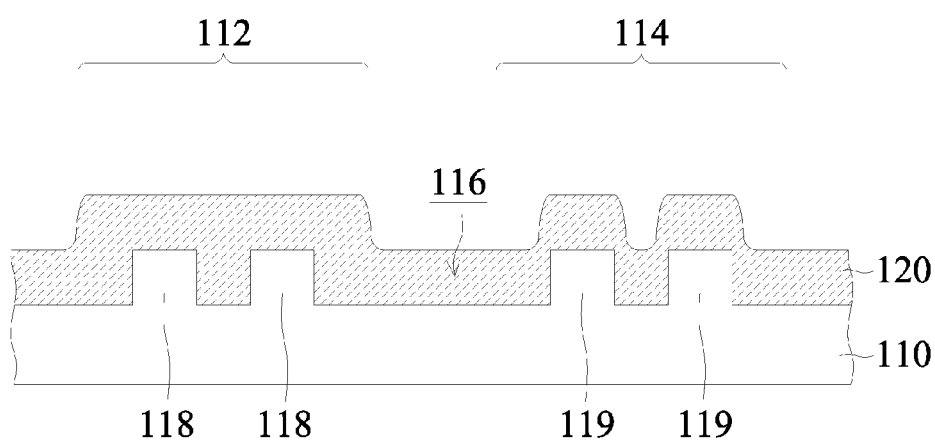
FIGS. 14A-14E are cross-sectional views of the structures along sectional lines 14A-14A, 14B-14B, 14C-14C, 14D-14D and 14E-14E shown in FIGS. 13A-13E, respectively, in accordance with some embodiments.

As shown in FIGS. 13A and 14A, a semiconductor substrate 110 is provided, in accordance with some embodiments. The semiconductor substrate 110 has a first device region 112 and a second device region 114, in accordance with some embodiments. An etching process is performed to form a trench 116 in the semiconductor substrate 110, in accordance with some embodiments. The trench 116 defines first active regions 118 in the first device region 112 and second active regions 119 in the second device region 114, in accordance with some embodiments. Thereafter, a first material layer 120 is deposited on the semiconductor substrate 110, in accordance with some embodiments. The first material layer 120 includes materials with a low thermal diffusion coefficient, in accordance with some embodiments.

In some embodiments, the first material layer 120 includes semiconductor nitride (such as silicon nitride). The deposition method of the first material layer 120 includes a chemical vapor deposition process (CVD process), a physical vapor deposition process (PVD process) or other suitable deposition processes, in accordance with some embodiments.

Figure 13B:
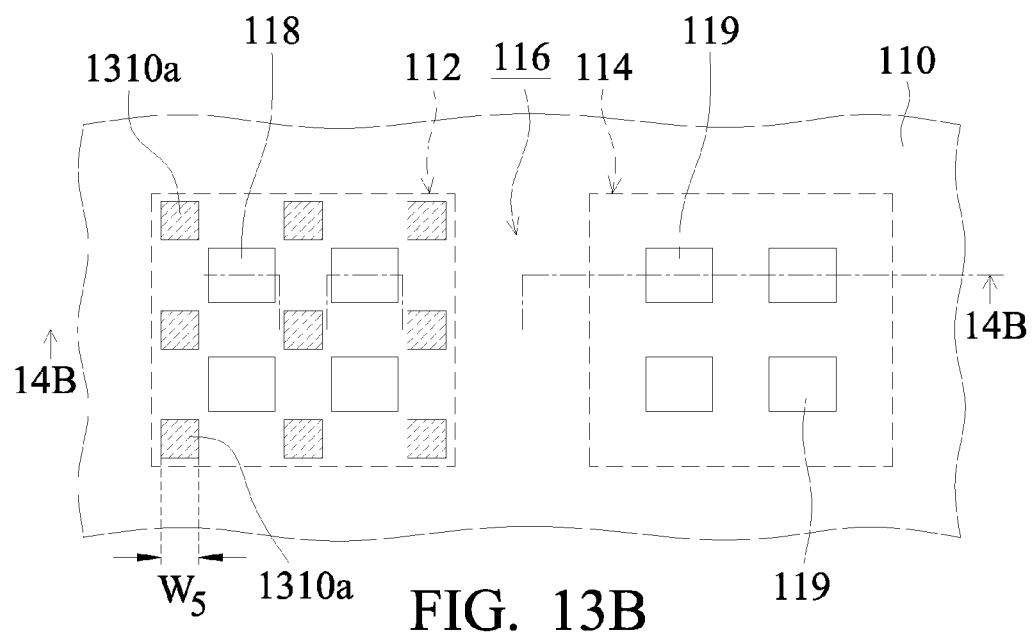
Figure 14B:
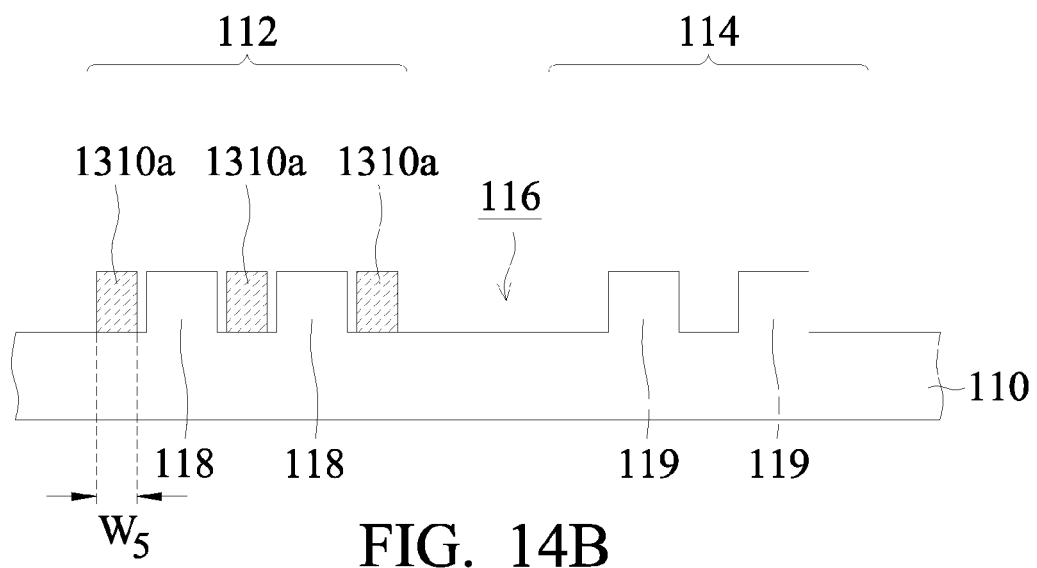

As shown in FIGS. 13B and 14B, the first material layer 120 is patterned into first pillar structures 1310a in the trench 116, in accordance with some embodiments. The first pillar structures 1310a are in the first device region 112 and surround the first active regions 118, in accordance with some embodiments. In some embodiments, the first pillar structure 1310a is between the first active regions 118.

The patterning method of the first material layer 120 includes a photolithography process and an etching process, in accordance with some embodiments. In some embodiments, the first pillar structure 1310a has a width (linewidth) W5 ranging from about 15 μm to about 150 μm. In some embodiments, the width W5 ranges from about 50 μm to about 70 μm.

Figure 13C:
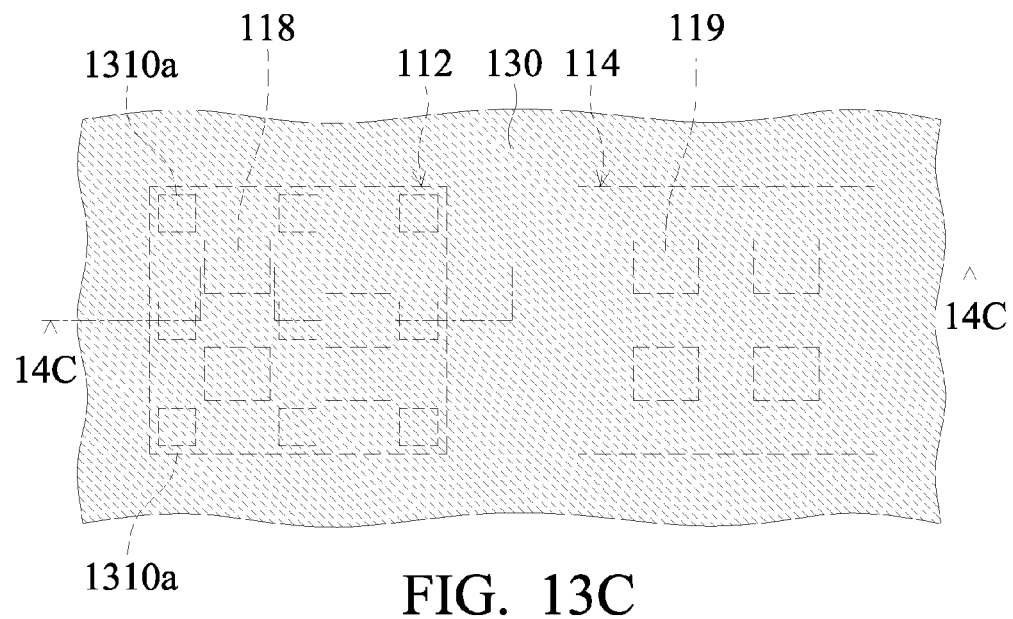
Figure 14C:
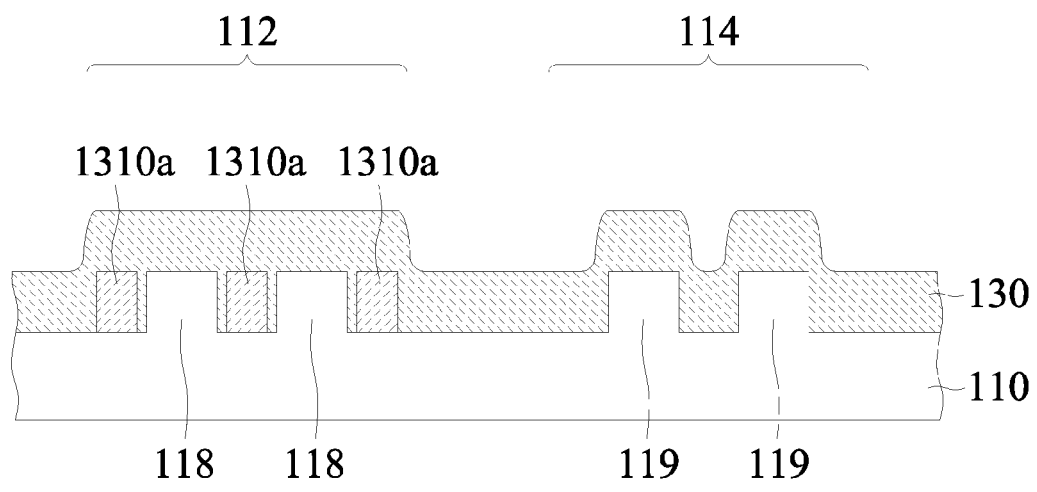

As shown in FIGS. 13C and 14C, a second material layer 130 is deposited on the semiconductor substrate 110, in accordance with some embodiments. The second material layer 130 has a thermal diffusion coefficient higher than that of the first pillar structures 1310a, in accordance with some embodiments.

The second material layer 130 includes semiconductors, metals or other suitable materials, in accordance with some embodiments. For example, the second material layer 130 includes silicon germanium, copper, gold, silver or aluminum. The deposition method of the second material layer 130 includes a CVD process, a PVD process or other suitable deposition processes, in accordance with some embodiments.

Figure 13D:
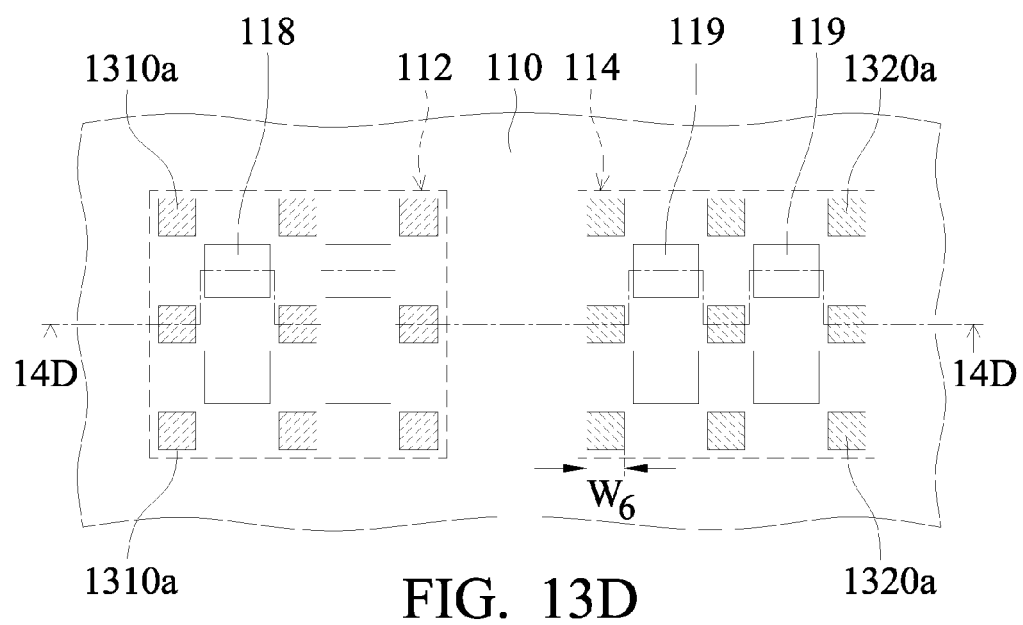
Figure 14D:
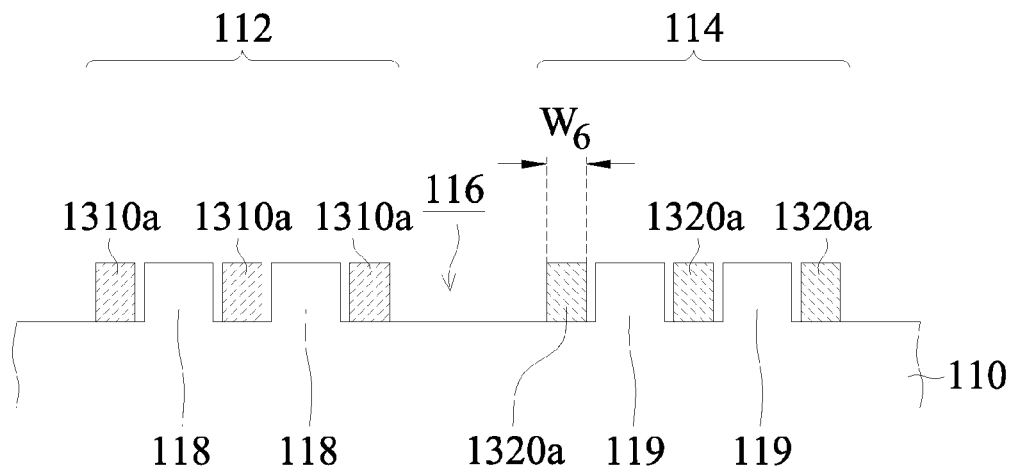

As shown in FIGS. 13D and 14D, the second material layer 130 is patterned into second pillar structures 1320a in the trench 116, in accordance with some embodiments. The second pillar structures 1320a are in the second device region 114 and surround the second active regions 119, in accordance with some embodiments. In some embodiments, the second pillar structure 1320a is between the second active regions 119.

The patterning method of the second material layer 130 includes a photolithography process and an etching process, in accordance with some embodiments. In some embodiments, the second pillar structure 1320a has a width (linewidth) W6 ranging from about 15 μm to about 150 μm. In some embodiments, the width W6 ranges from about 50 μm to about 70 μm.

Figure 13E:
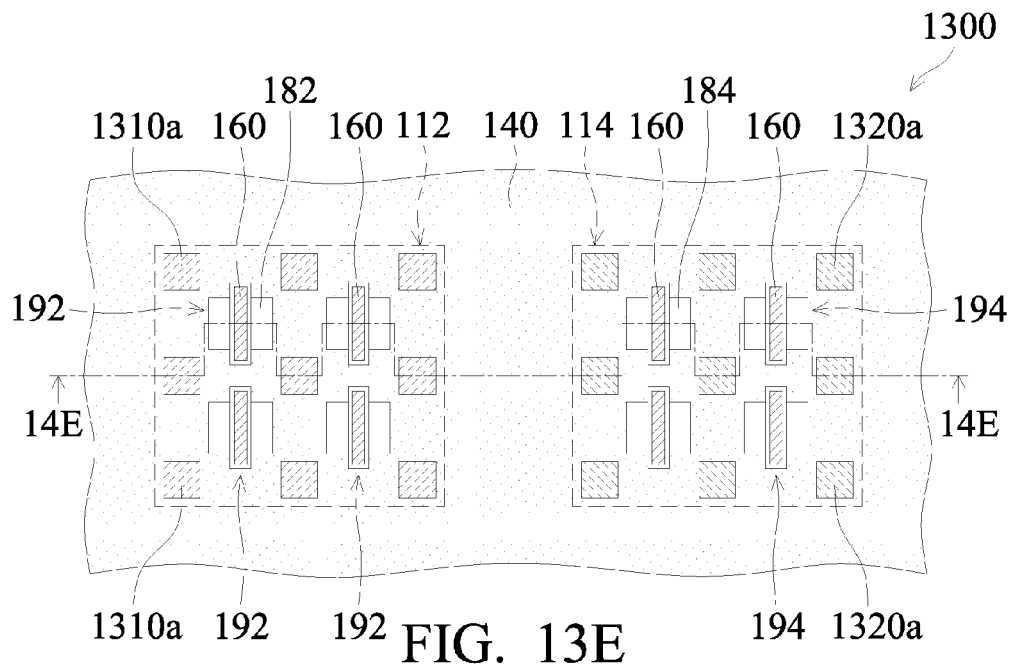
Figure 14E:
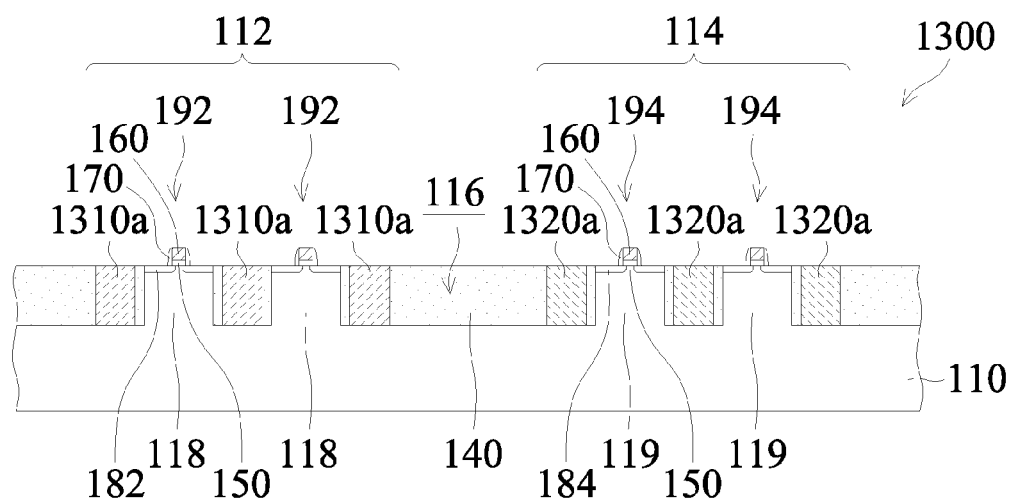

As shown in FIGS. 13E and 14E, an isolation structure 140 is formed in the trench 116 unoccupied by the first pillar structures 1310a and the second pillar structures 1320a, in accordance with some embodiments. The isolation structure 140 is configured to electrically isolate neighboring devices (e.g. transistors) from one another.

The isolation structure 140 is made of a dielectric material, such as silicon oxide, silicon nitride, silicon oxynitride, fluoride-doped silicate glass (FSG), a low-K dielectric material, other suitable materials, or combinations thereof, in accordance with some embodiments. The isolation structure 140 is formed by using an isolation technology, such as local oxidation of semiconductor (LOCOS), shallow trench isolation (STI), or the like, in accordance with some embodiments.

Thereafter, gate dielectric layers 150 and gates 160 are formed over the active regions 118 and 119 of the semiconductor substrate 110, in accordance with some embodiments. Spacer layers 170 are formed on sidewalls of the gate dielectric layers 150 and the gates 160.

Thereafter, an ion implantation process is performed by using the gates 160 as masks to form doped regions 182 and 184 in the first active regions 118 and the second active regions 119, respectively, in accordance with some embodiments. Afterwards, an annealing process is performed to activate the implanted dopants (such as n-type dopants or p-type dopants) in the doped regions 182 and 184, in accordance with some embodiments.

In some embodiments, the doped regions 182 and 184 are configured to be source regions and drain regions. In this step, first transistors 192 in the first device region 112 and second transistors 194 in the second device region 114 are substantially formed.

In some embodiments, the first pillar structures 1310a have a thermal diffusion coefficient less than that of the second pillar structures 1320a. Therefore, after the annealing process, the first pillar structures 1310a may maintain a higher temperature than the second pillar structures 1320a. Hence, the first device region 112 with the first pillar structures 1310a may maintain a higher temperature than the second device region 114 with the second pillar structures 1320a. The first device region 112 is referred to as a hot zone, and the second device region 114 is referred to as a cold zone, in accordance with some embodiments.

Therefore, the dopants in the first device region 112 (i.e., the hot zone) are activated more uniformly than the dopants in the second device region 114 (i.e., the cold zone). As a result, the threshold voltage of the first transistors 192 in the first device region 112 is lower than the threshold voltage of the second transistors 194 in the second device region 114. Thereby, after the same annealing process, the transistors on the same wafer (or the same chip) may have different threshold voltages to achieve different functions.

Figure 15A:
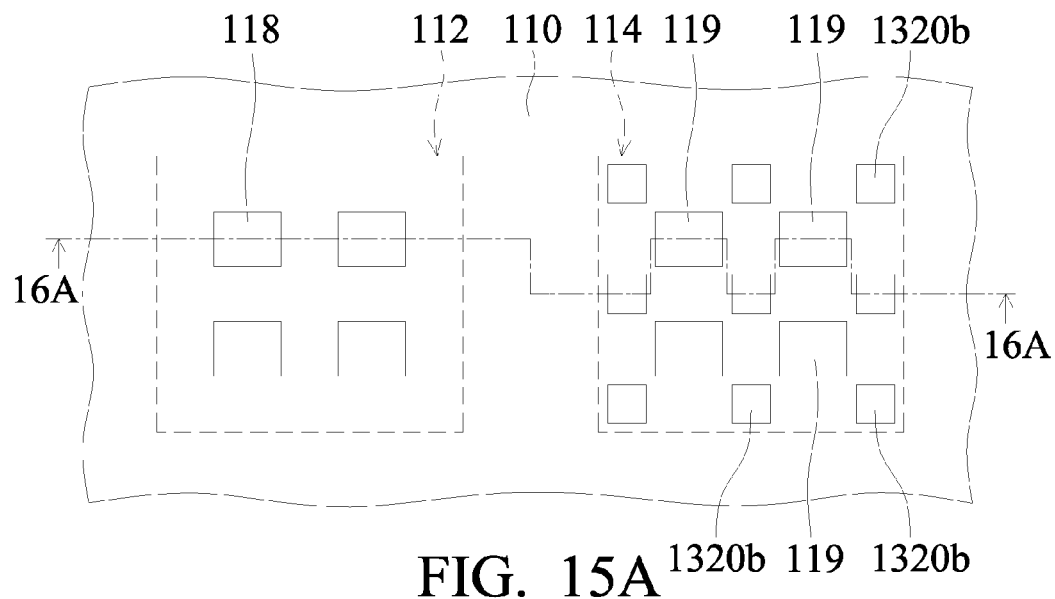
FIGS. 15A-15B are top views of various stages of a process for forming a semiconductor device structure, in accordance with some embodiments.
Figure 15B:
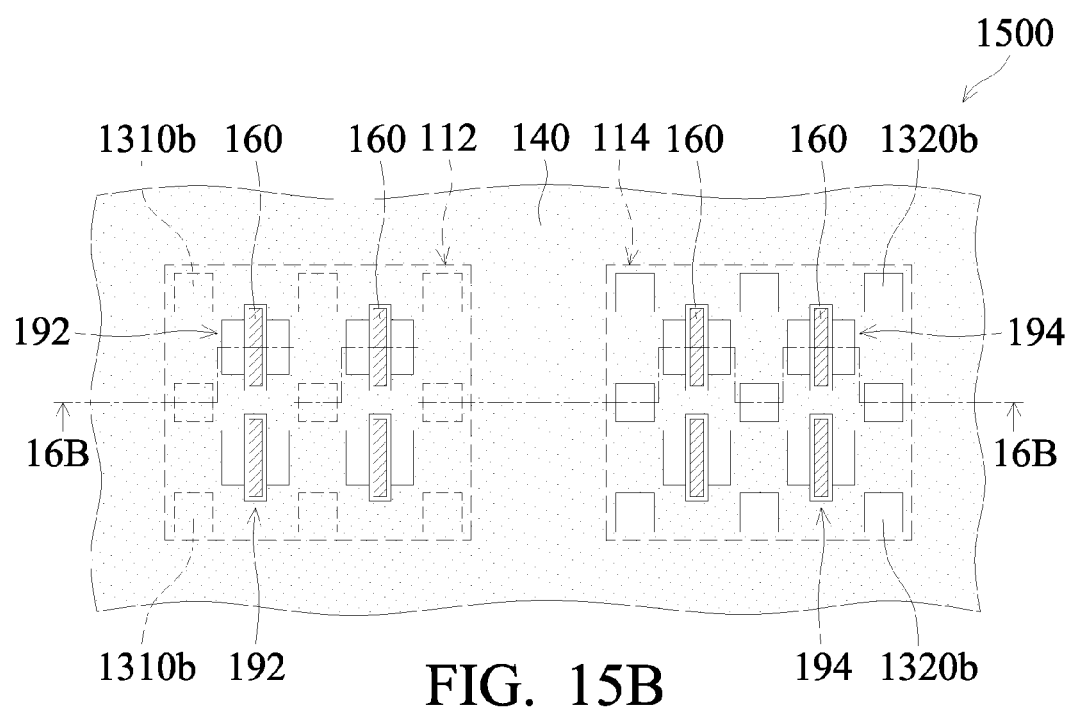
Figure 16A:
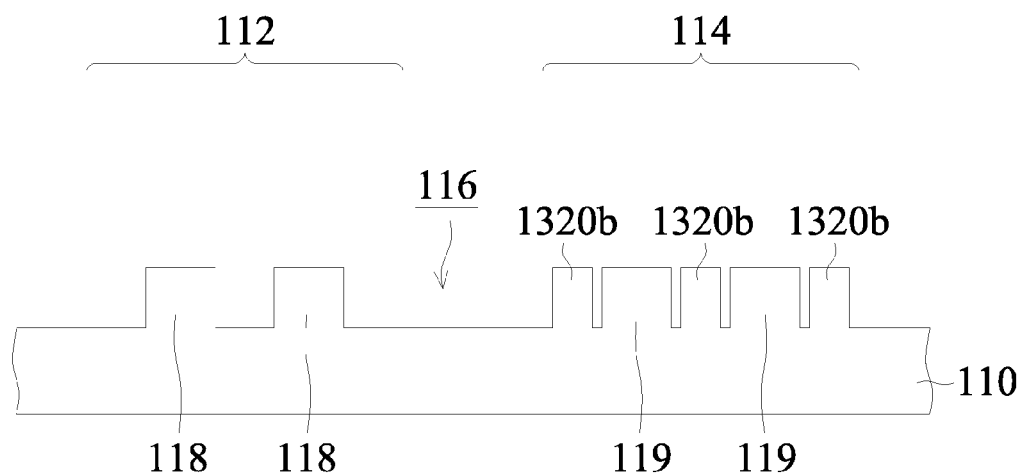
FIGS. 16A-16B are cross-sectional views of the structures along sectional lines 16A-16A and 16B-16B shown in FIGS. 15A-15B, respectively, in accordance with some embodiments.
Figure 16B:
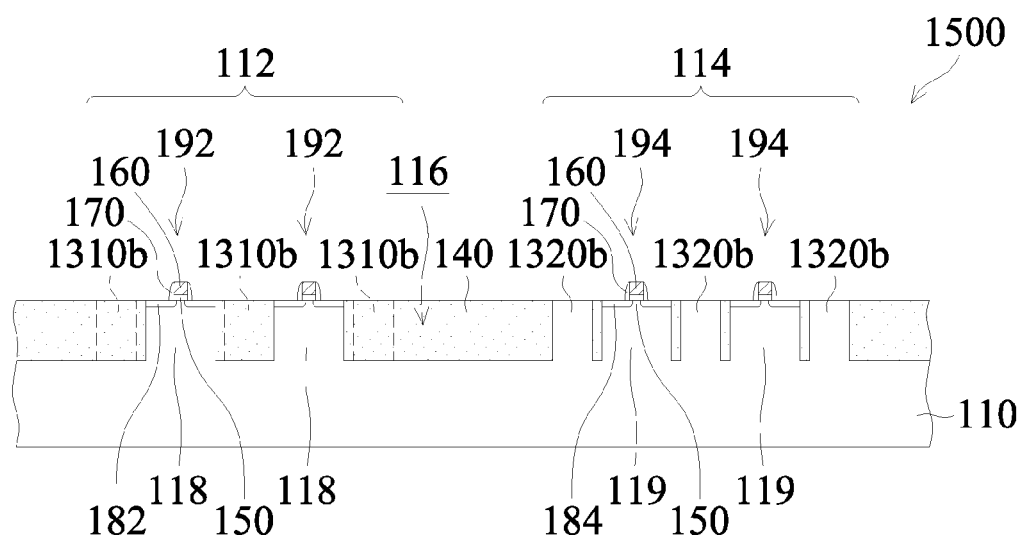

FIGS. 15A-15B are top views of various stages of a process for forming a semiconductor device structure 1500, in accordance with some embodiments. FIGS. 16A-16B are cross-sectional views of the structures along sectional lines 16A-16A and 16B-16B shown in FIGS. 15A-15B, respectively, in accordance with some embodiments.

As shown in FIGS. 15A and 16A, a semiconductor substrate 110 is provided, in accordance with some embodiments. The semiconductor substrate 110 has a first device region 112 and a second device region 114, in accordance with some embodiments. An etching process is performed to form a trench 116 in the semiconductor substrate 110, in accordance with some embodiments. The trench 116 defines first active regions 118 in the first device region 112, second active regions 119 and second pillar structures 1320b in the second device region 114, in accordance with some embodiments. The second pillar structures 1320b surround the second active regions 119, in accordance with some embodiments. The second pillar structure 1320b is between the second active regions 119, in accordance with some embodiments.

As shown in FIGS. 15B and 16B, an isolation structure 140 is formed in the trench 116, in accordance with some embodiments. Compared with the embodiment of FIGS. 13A-13E, the embodiment of FIGS. 15A-15B uses the material of the semiconductor substrate 110 to form the second pillar structures 1320b. Furthermore, the embodiment of FIGS. 15A-15B uses the material of the isolation structure 140 to form the first pillar structures 1310b (shown as the dotted line in FIGS. 15B and 16B).

In some embodiments, the first pillar structures 1310b have a thermal diffusion coefficient less than that of the second pillar structures 1320b. In some embodiments, the first pillar structures 1310b include semiconductor oxides (such as silicon oxide). In some embodiments, the second pillar structures 1320b include semiconductors (such as silicon).

Thereafter, gate dielectric layers 150 and gates 160 are formed over the active regions 118 and 119 of the semiconductor substrate 110, in accordance with some embodiments. Spacer layers 170 are formed on sidewalls of the gate dielectric layers 150 and the gates 160.

Thereafter, an ion implantation process is performed by using the gates 160 as masks to form doped regions 182 and 184 in the first active regions 118 and the second active regions 119, respectively, in accordance with some embodiments. Afterwards, an annealing process is performed to activate the implanted dopants (such as n-type dopants or p-type dopants) in the doped regions 182 and 184, in accordance with some embodiments.

In some embodiments, the doped regions 182 and 184 are configured to be source regions and drain regions. In this step, first transistors 192 in the first device region 112 and second transistors 194 in the second device region 114 are substantially formed. In some embodiments, the threshold voltage of the first transistors 192 surrounded by the first pillar structures 1310b is lower than that of the second transistors 194 surrounded by the second pillar structures 1320b.

Figure 17:
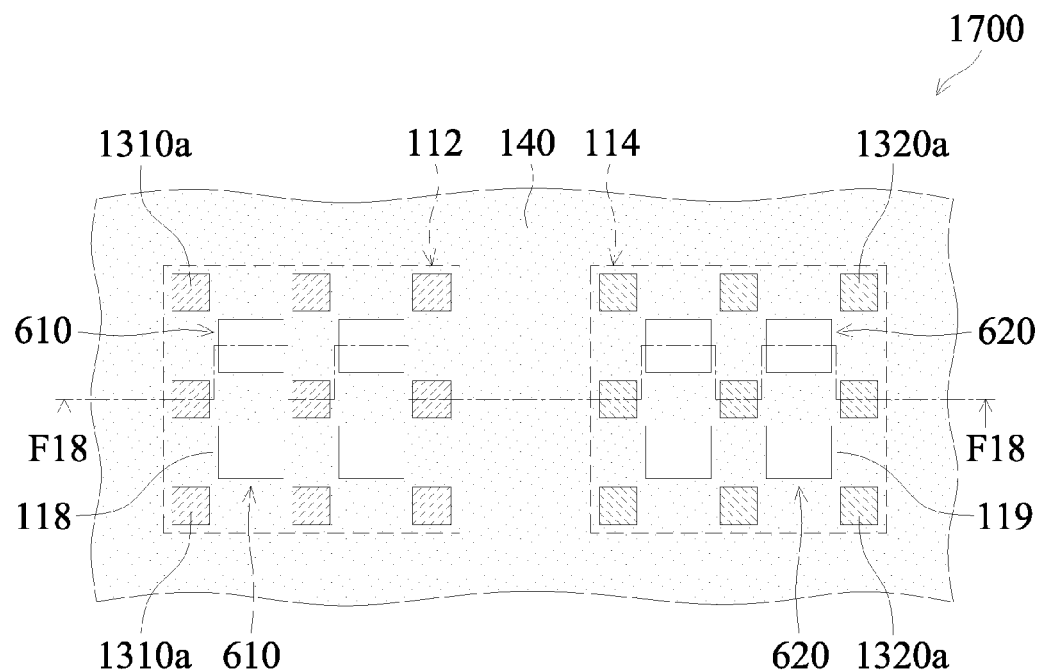
FIG. 17 is a top view of a semiconductor device structure, in accordance with some embodiments.
Figure 18:
FIG. 18 is a cross-sectional view of the structure along a sectional line F18-F18 shown in FIG. 17, respectively, in accordance with some embodiments.

FIG. 17 is a top view of a semiconductor device structure 1700, in accordance with some embodiments. FIG. 18 is a cross-sectional view of the structure along a sectional line F18-F18 shown in FIG. 17, respectively, in accordance with some embodiments.

As shown in FIGS. 17 and 18, after the step of FIGS. 13D and 14D, an isolation structure 140 is formed in the trench 116 unoccupied by the first pillar structures 1310a and the second pillar structures 1320a, in accordance with some embodiments. In some embodiments, the first pillar structures 1310a include semiconductor nitride (such as silicon nitride). The second pillar structures 1320a include semiconductor or metal, in accordance with some embodiments. For example, the second pillar structures 1320a include silicon germanium, copper, gold, silver or aluminum.

Thereafter, an ion implantation process is performed on the first active regions 118 and the second active regions 119. Afterwards, an annealing process is performed to activate the implanted dopants (such as n-type dopants or p-type dopants) in the first active regions 118 and the second active regions 119, in accordance with some embodiments. In this step, first resistors 610 in the first active regions 118 and second resistors 620 in the second active regions 119 are substantially formed.

In some embodiments, the first pillar structures 1310a have a thermal diffusion coefficient less than that of the second pillar structures 1320a. Therefore, after the annealing process, the first pillar structures 1310a may maintain a higher temperature than the second pillar structures 1320a. Hence, the first device region 112 with the first pillar structures 1310a may maintain a higher temperature than the second device region 114 with the second pillar structures 1320a.

Therefore, the dopants in the first device region 112 (i.e., the hot zone) are activated more uniformly than the dopants in the second device region 114 (i.e., the cold zone). As a result, the resistance of the first resistors 610 in the first device region 112 is lower than the resistance of the second resistors 620 in the second device region 114. Thereby, after the same annealing process, the resistors on the same wafer (or the same chip) may have different resistances to achieve different functions.

Figure 19:
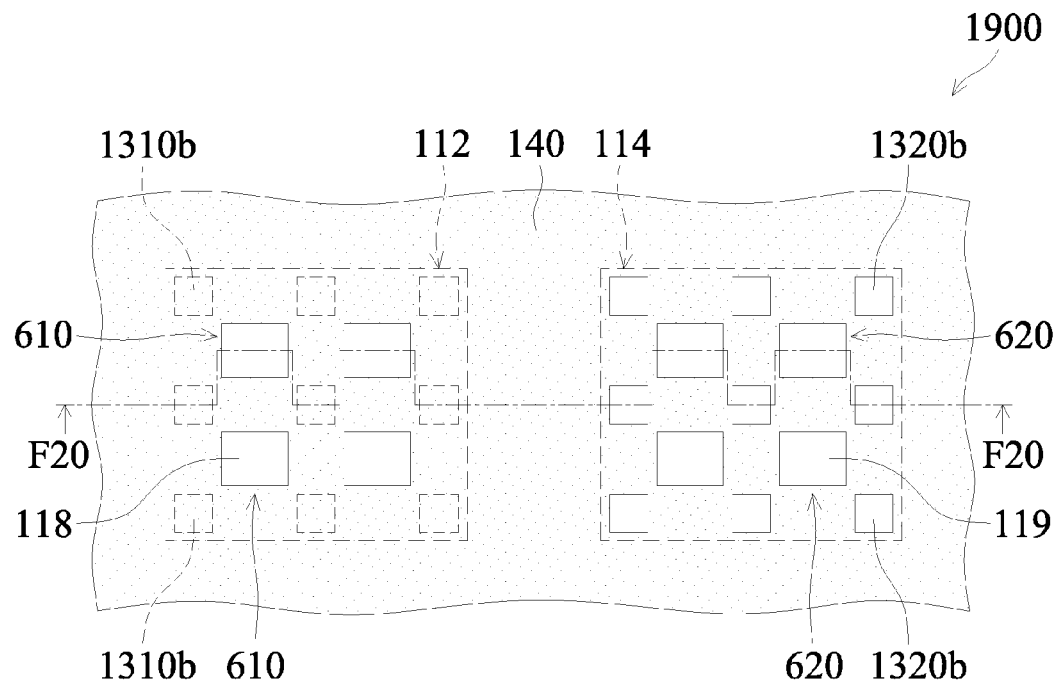
FIG. 19 is a top view of a semiconductor device structure, in accordance with some embodiments.
Figure 20:
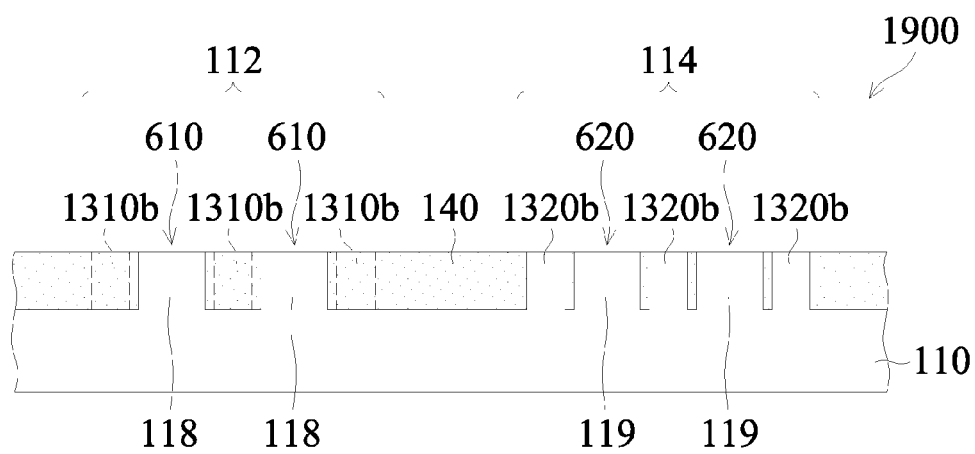
FIG. 20 is a cross-sectional view of the structure along a sectional line F20-F20 shown in FIG. 19, respectively, in accordance with some embodiments.

FIG. 19 is a top view of a semiconductor device structure 1900, in accordance with some embodiments. FIG. 20 is a cross-sectional view of the structure along a sectional line F20-F20 shown in FIG. 19, respectively, in accordance with some embodiments.

It should be noted that the embodiment of FIGS. 19-20 is similar to the embodiment of FIGS. 17-18 except that the first pillar structures 1310b of the embodiment of FIGS. 19-20 have the same material as the isolation structure 140, and the second pillar structures 1320b has the same material as the semiconductor substrate 110.

In some embodiments, the first pillar structures 1310b and the isolation structure 140 are formed in the same process, and the second pillar structures 1320b and the first active regions 118 and the second active regions 119 are formed in the same process.

In some embodiments, the first pillar structures 1310b have a thermal diffusion coefficient less than that of the second pillar structures 1320b. In some embodiments, the first pillar structures 1310b include semiconductor oxides (such as silicon oxide). In some embodiments, the second pillar structures 1320b include semiconductors (such as silicon). In some embodiments, the resistance of the first resistors 610 in the first device region 112 is lower than the resistance of the second resistors 620 in the second device region 114.

Figure 21:
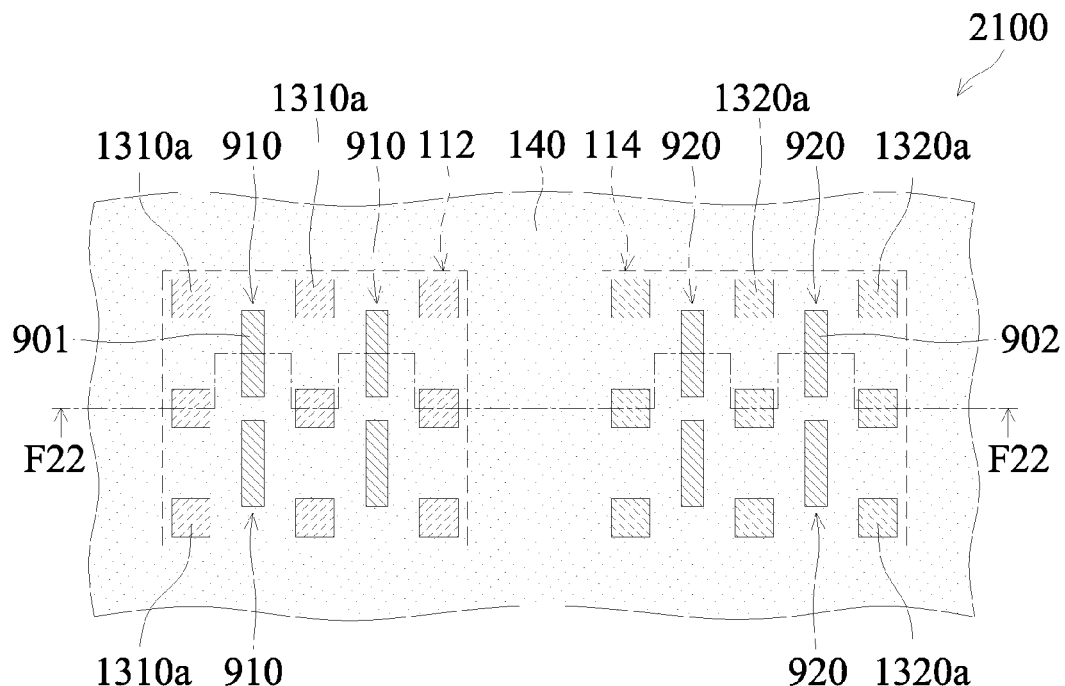
FIG. 21 is a top view of a semiconductor device structure, in accordance with some embodiments.
Figure 22:
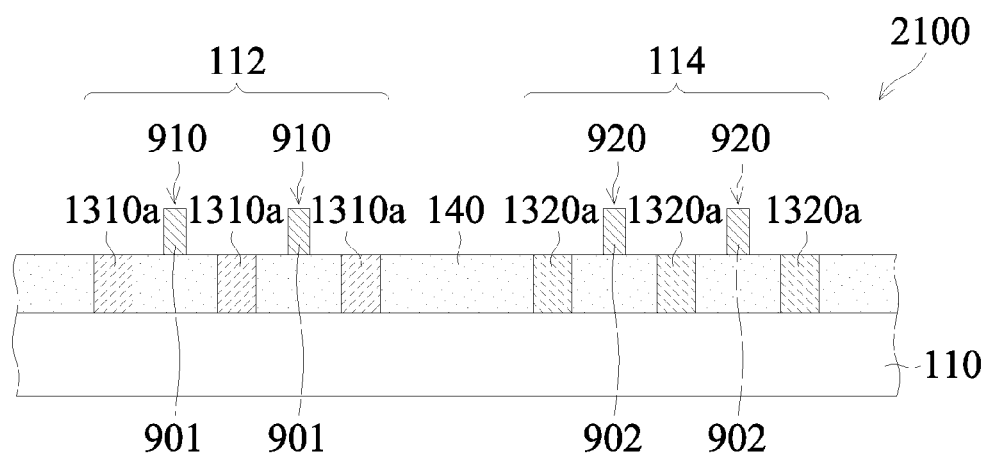
FIG. 22 is a cross-sectional view of the structure along a sectional line F22-F22 shown in FIG. 21, respectively, in accordance with some embodiments.

FIG. 21 is a top view of a semiconductor device structure 2100, in accordance with some embodiments. FIG. 22 is a cross-sectional view of the structure along a sectional line F22-F22 shown in FIG. 21, respectively, in accordance with some embodiments.

It should be noted that the embodiment of FIGS. 21-22 is similar to the embodiment of FIGS. 17-18 except that the first resistors 910 in the first device region 112 and the second resistors 920 in the second device region 114 are located on the isolation structure 140.

In some embodiments, the first and second resistors 910 and 920 are made of semiconductor materials (such as polysilicon). In some embodiments, the method of forming the first and second resistors 910 and 920 includes depositing a semiconductor material layer (not shown) on the isolation structure 140; patterning the semiconductor material layer into separated portions 901 and 902; implanting the separated portions 901 and 902 with dopants; and annealing the separated portions 901 and 902 to activate the dopants.

In some embodiments, the first pillar structures 1310a have a thermal diffusion coefficient less than that of the second pillar structures 1320a. Therefore, after the annealing process, the first pillar structures 1310a may maintain a higher temperature than the second pillar structures 1320a. Hence, the first device region 112 with the first pillar structures 1310a may maintain a higher temperature than the second device region 114 with the second pillar structures 1320a.

Therefore, the dopants in the first device region 112 (i.e., the hot zone) are activated more uniformly than the dopants in the second device region 114 (i.e., the cold zone). As a result, the resistance of the first resistors 910 in the first device region 112 is lower than the resistance of the second resistors 920 in the second device region 114.

Figure 23:
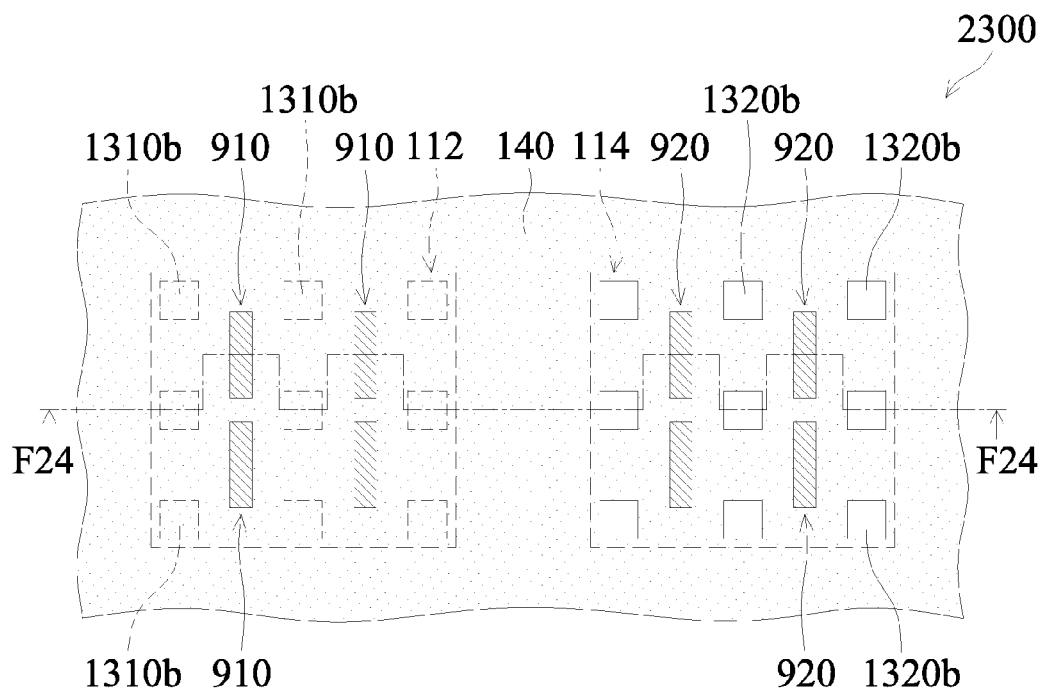
FIG. 23 is a top view of a semiconductor device structure, in accordance with some embodiments.
Figure 24:
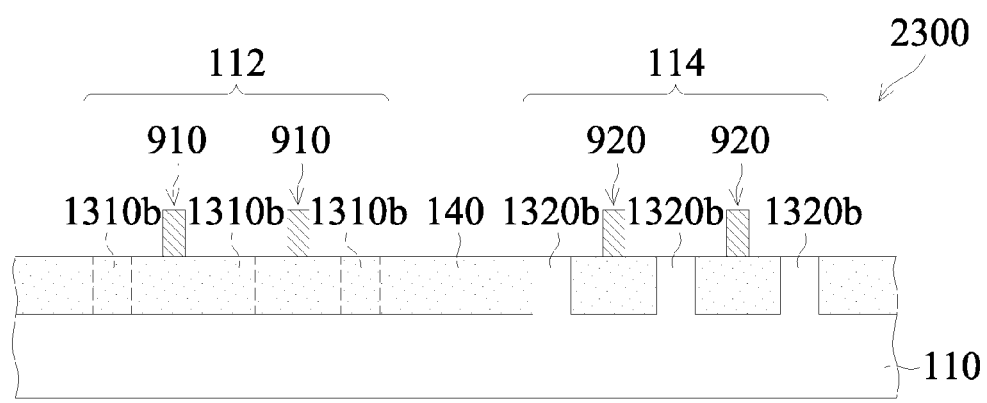
FIG. 24 is a cross-sectional view of the structure along a sectional line F24-F24 shown in FIG. 23, respectively, in accordance with some embodiments.

FIG. 23 is a top view of a semiconductor device structure 2300, in accordance with some embodiments. FIG. 24 is a cross-sectional view of the structure along a sectional line F24-F24 shown in FIG. 23, in accordance with some embodiments.

It should be noted that the embodiment of FIGS. 23-24 is similar to the embodiment of FIGS. 21-22 except that the first pillar structures 1310b of the embodiment of FIGS. 23-24 have the same material as the isolation structures 140 and the second pillar structures 1320b have the same material as the semiconductor substrate 110. In some embodiments, the first pillar structures 1310b and the isolation structure 140 are formed in the same process.

In some embodiments, the first pillar structures 1310b have a thermal diffusion coefficient less than that of the second pillar structures 1320b. In some embodiments, the first pillar structures 1310b include semiconductor oxides (such as silicon oxide). In some embodiments, the second pillar structures 1320b include semiconductors (such as silicon). In some embodiments, the resistance of the first resistors 910 in the first device region 112 is lower than the resistance of the second resistors 920 in the second device region 114.

Figure 25:
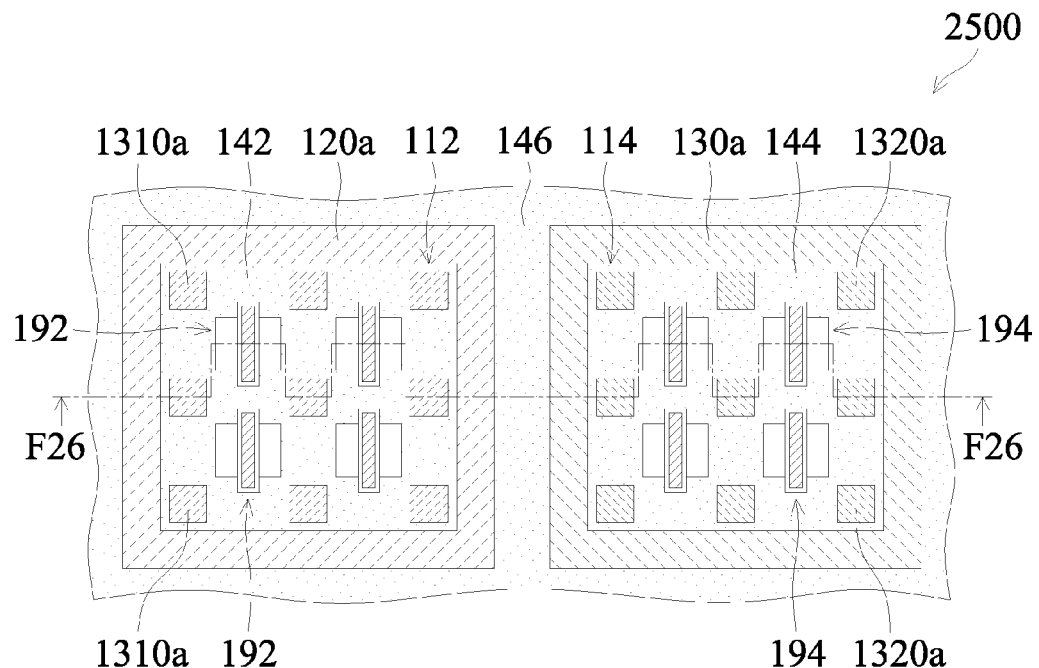
FIG. 25 is a top view of a semiconductor device structure, in accordance with some embodiments.
Figure 26:
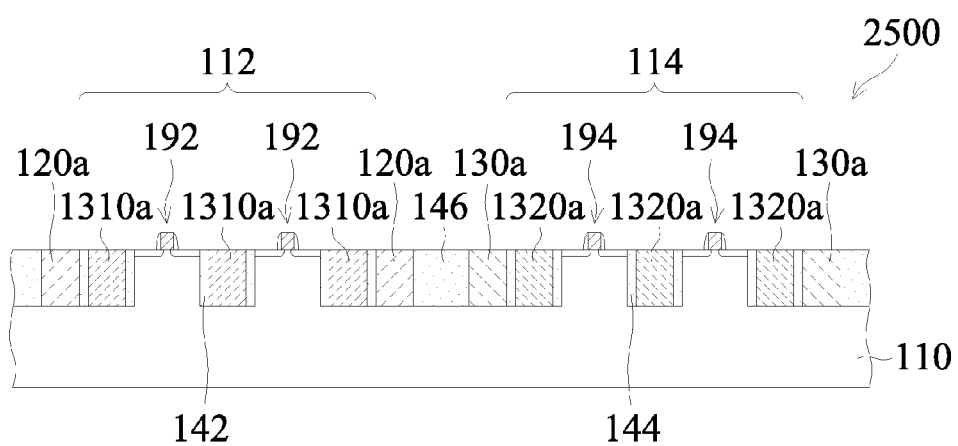
FIG. 26 is a cross-sectional view of the structure along a sectional line F26-F26 shown in FIG. 25, respectively, in accordance with some embodiments.

FIG. 25 is a top view of a semiconductor device structure 2500, in accordance with some embodiments. FIG. 26 is a cross-sectional view of the structure along a sectional line F26-F26 shown in FIG. 25, respectively, in accordance with some embodiments.

In some embodiments, as shown in FIGS. 25-26, a semiconductor device structure 2500 is similar to the semiconductor device structure 1300 of FIG. 13E, except that the semiconductor device structure 2500 further has the first and second annular structure 120a and 130a of FIG. 1F. The first annular structure 120a surrounds the first pillar structures 1310a and the first transistors 192, and the second annular structure 130a surrounds the second pillar structures 1320a and the second transistors 194, in accordance with some embodiments.

Figure 27:
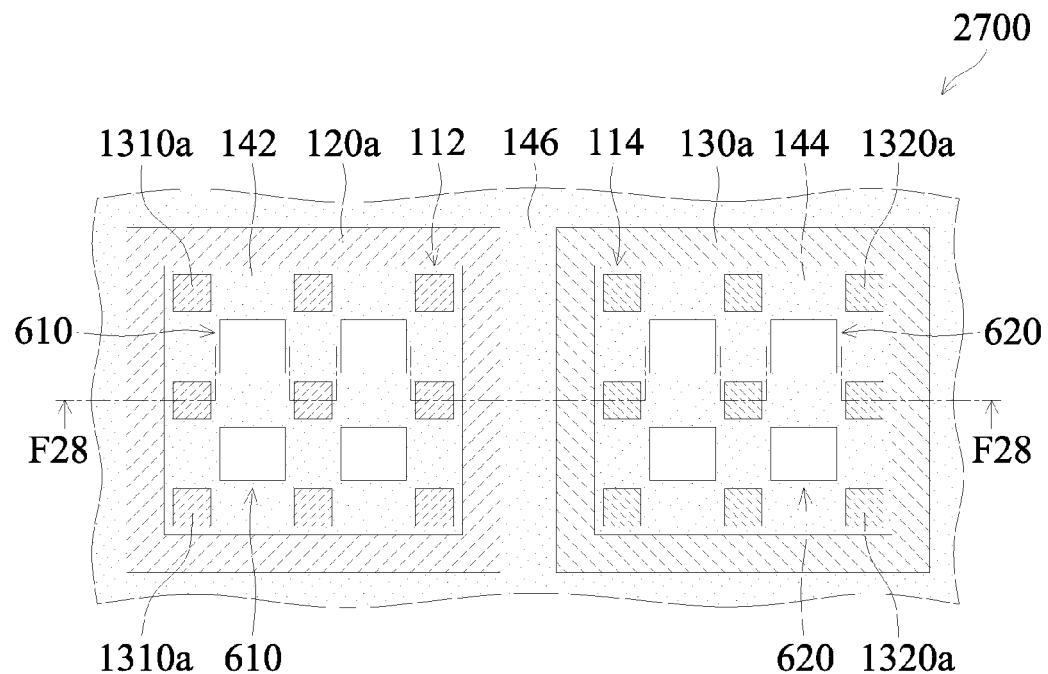
FIG. 27 is a top view of a semiconductor device structure, in accordance with some embodiments.
Figure 28:
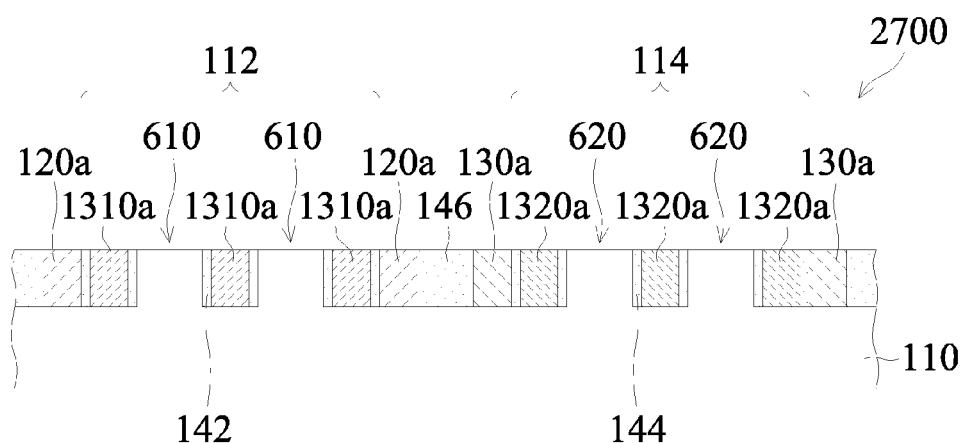
FIG. 28 is a cross-sectional view of the structure along a sectional line F28-F28 shown in FIG. 27, respectively, in accordance with some embodiments.

FIG. 27 is a top view of a semiconductor device structure 2700, in accordance with some embodiments. FIG. 28 is a cross-sectional view of the structure along a sectional line F28-F28 shown in FIG. 27, respectively, in accordance with some embodiments.

In some embodiments, as shown in FIGS. 27-28, a semiconductor device structure 2700 is similar to the semiconductor device structure 1700 of FIG. 17, except that the semiconductor device structure 2700 further has the first and second annular structure 120a and 130a of FIG. 5. The first annular structure 120a surrounds the first pillar structures 1310a and the first resistors 610, and the second annular structure 130a surrounds the second pillar structures 1320a and the second resistors 620, in accordance with some embodiments.

Figure 29:
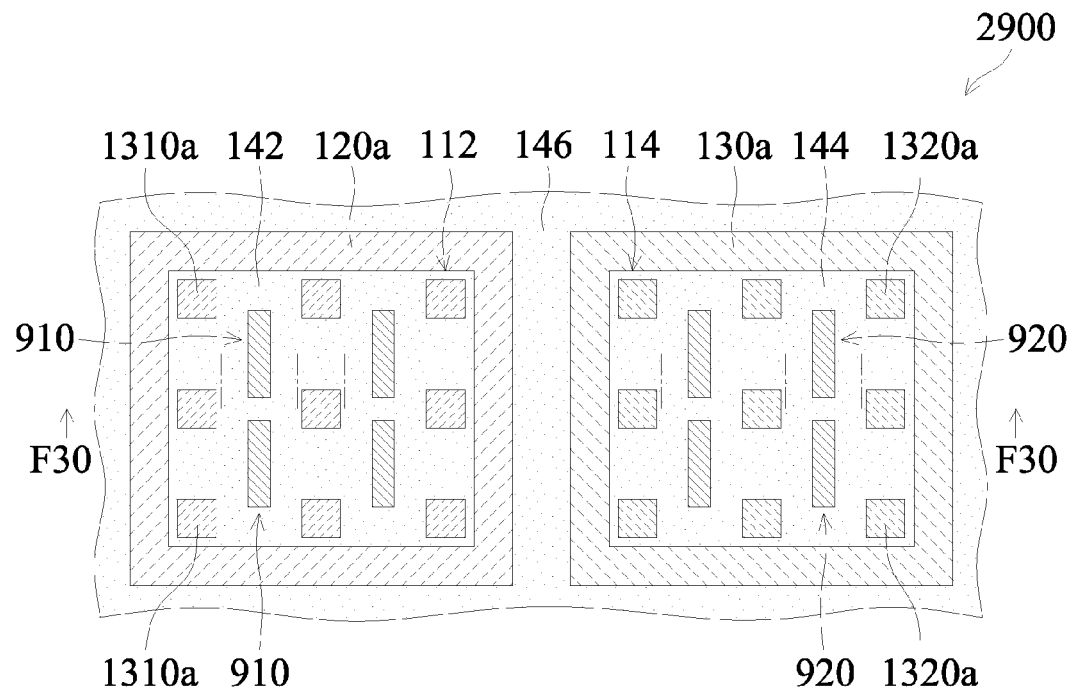
FIG. 29 is a top view of a semiconductor device structure, in accordance with some embodiments.
Figure 30:
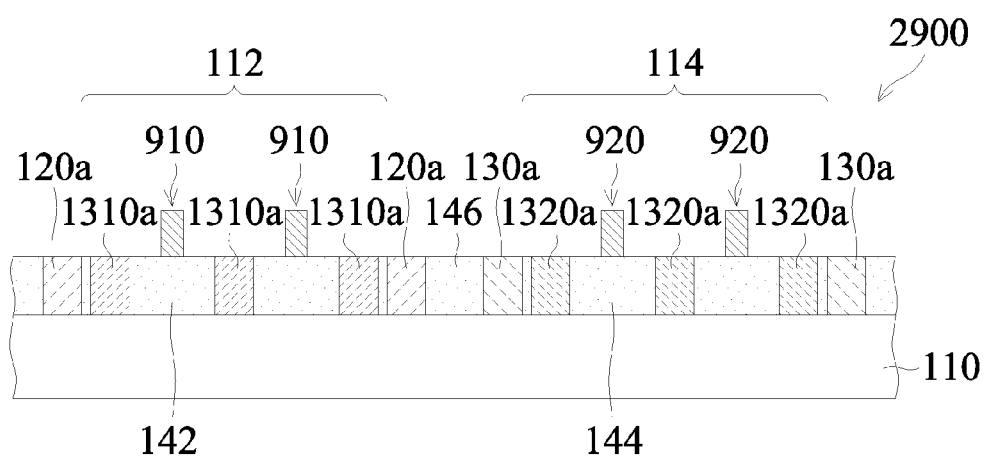
FIG. 30 is a cross-sectional view of the structure along a sectional line F30-F30 shown in FIG. 29, respectively, in accordance with some embodiments.

FIG. 29 is a top view of a semiconductor device structure 2900, in accordance with some embodiments. FIG. 30 is a cross-sectional view of the structure along a sectional line F30-F30 shown in FIG. 29, respectively, in accordance with some embodiments.

In some embodiments, as shown in FIGS. 29-30, a semiconductor device structure 2900 is similar to the semiconductor device structure 2100 of FIG. 21, except that the semiconductor device structure 2900 further has the first and second annular structure 120a and 130a of FIG. 9. The first annular structure 120a surrounds the first pillar structures 1310a and the first resistors 910, and the second annular structure 130a surrounds the second pillar structures 1320a and the second resistors 920, in accordance with some embodiments.

Figure 31:
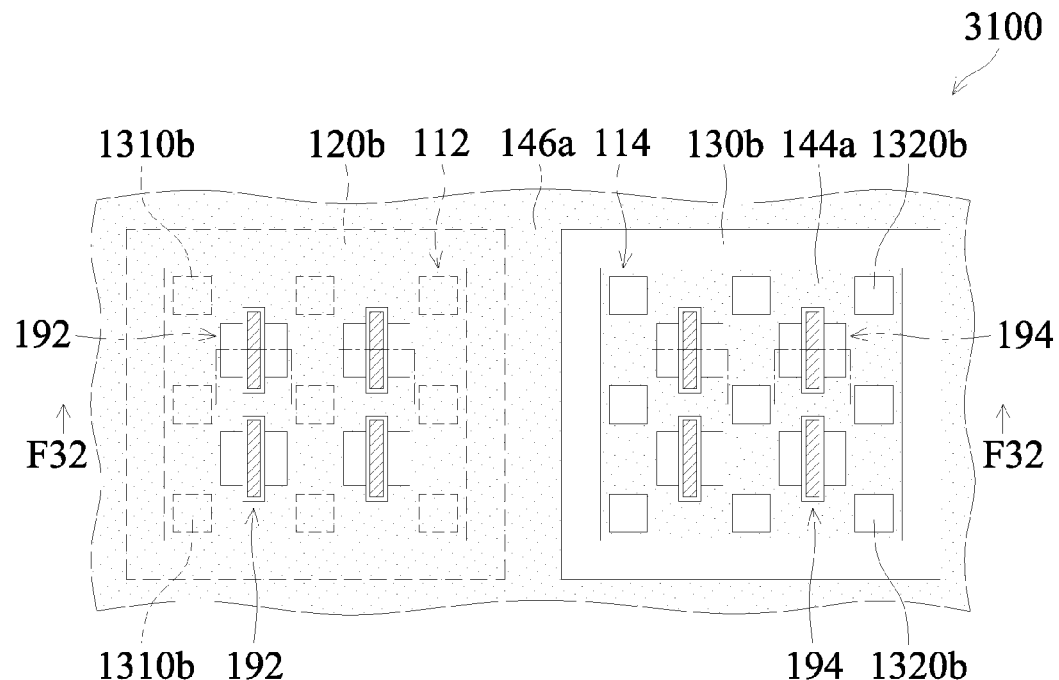
FIG. 31 is a top view of a semiconductor device structure, in accordance with some embodiments.
Figure 32:
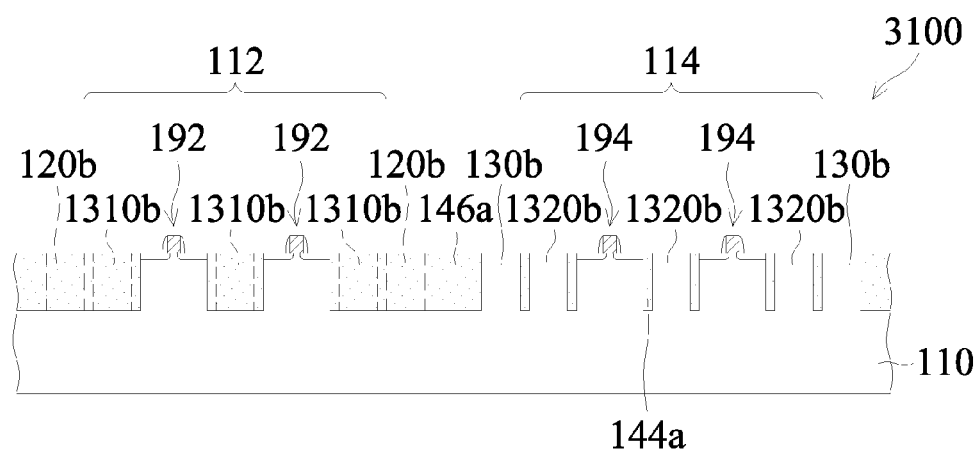
FIG. 32 is a cross-sectional view of the structure along a sectional line F32-F32 shown in FIG. 31, respectively, in accordance with some embodiments.

FIG. 31 is a top view of a semiconductor device structure 3100, in accordance with some embodiments. FIG. 32 is a cross-sectional view of the structure along a sectional line F32-F32 shown in FIG. 31, respectively, in accordance with some embodiments.

In some embodiments, as shown in FIGS. 31-32, a semiconductor device structure 3100 is similar to the semiconductor device structure 1500 of FIG. 15B, except that the semiconductor device structure 3100 further has the second annular structure 130b of FIG. 3B. The second annular structure 130*b* surrounds the second pillar structures 1320*b* and the second transistors 194, in accordance with some embodiments.

Figure 33:
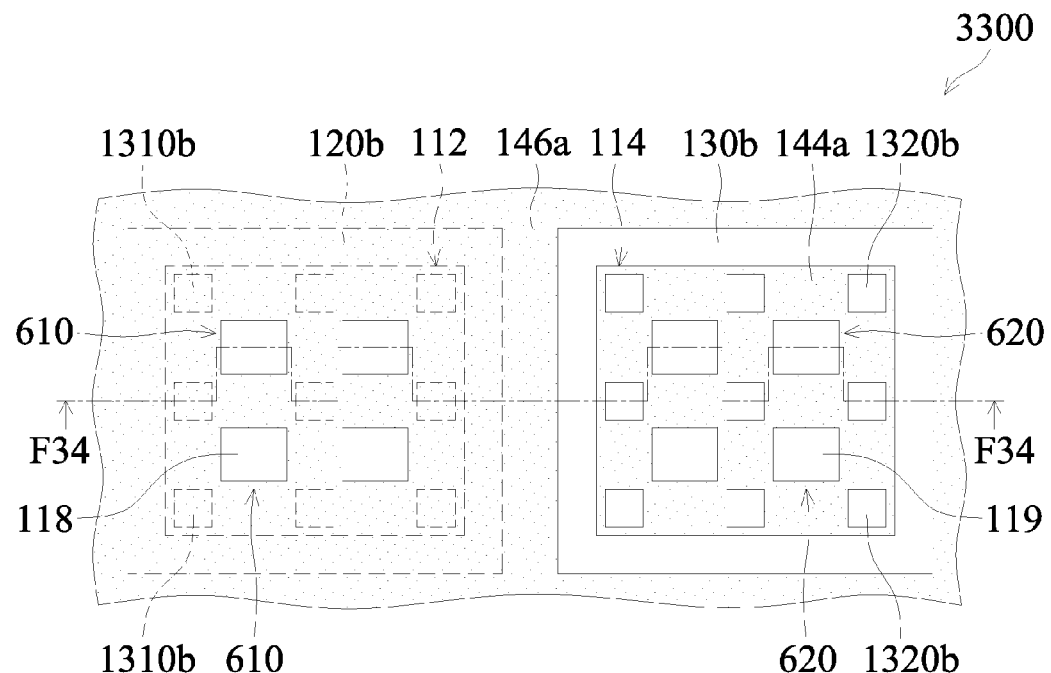
FIG. 33 is a top view of a semiconductor device structure, in accordance with some embodiments.
Figure 34:
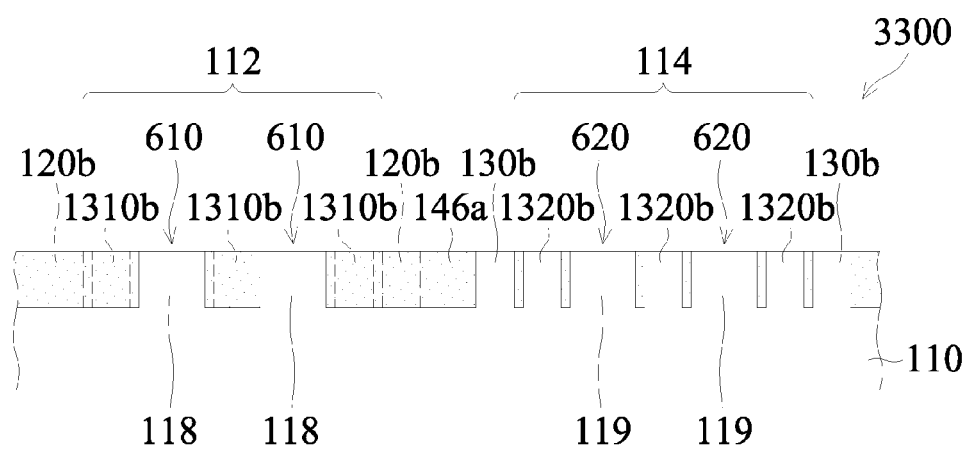
FIG. 34 is a cross-sectional view of the structure along a sectional line F34-F34 shown in FIG. 33, respectively, in accordance with some embodiments.

FIG. 33 is a top view of a semiconductor device structure 3300, in accordance with some embodiments. FIG. 34 is a cross-sectional view of the structure along a sectional line F34-F34 shown in FIG. 33, respectively, in accordance with some embodiments.

In some embodiments, as shown in FIGS. 33-34, a semiconductor device structure 3300 is similar to the semiconductor device structure 1900 of FIG. 19, except that the semiconductor device structure 3300 further has the second annular structure 130*b* of FIG. 7. The second annular structure 130*b* surrounds the second pillar structures 1320*b* and the second resistors 620, in accordance with some embodiments.

Figure 35:
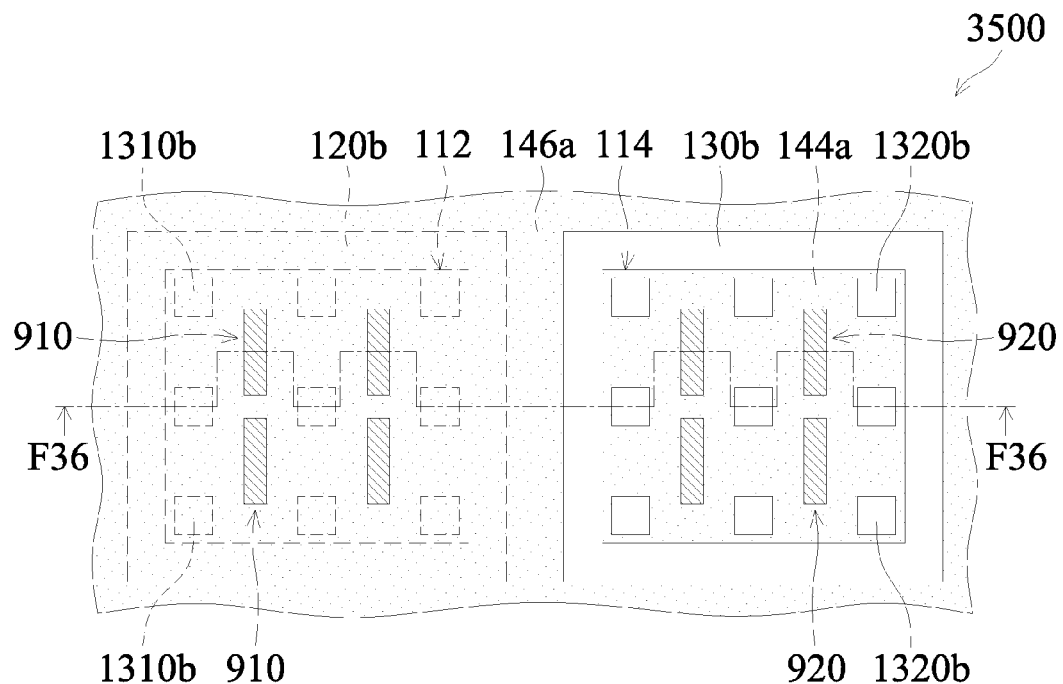
FIG. 35 is a top view of a semiconductor device structure, in accordance with some embodiments.
Figure 36:
FIG. 36 is a cross-sectional view of the structure along a sectional line F36-F36 shown in FIG. 35, respectively, in accordance with some embodiments.

FIG. 35 is a top view of a semiconductor device structure 3500, in accordance with some embodiments. FIG. 36 is a cross-sectional view of the structure along a sectional line F36-F36 shown in FIG. 35, respectively, in accordance with some embodiments.

In some embodiments, as shown in FIGS. 35-36, a semiconductor device structure 3500 is similar to the semiconductor device structure 2300 of FIG. 23, except that the semiconductor device structure 3500 further has the second annular structure 130*b* of FIG. 11. The second annular structure 130*b* surrounds the second pillar structures 1320*b* and the second resistors 920, in accordance with some embodiments.

Figure 37:
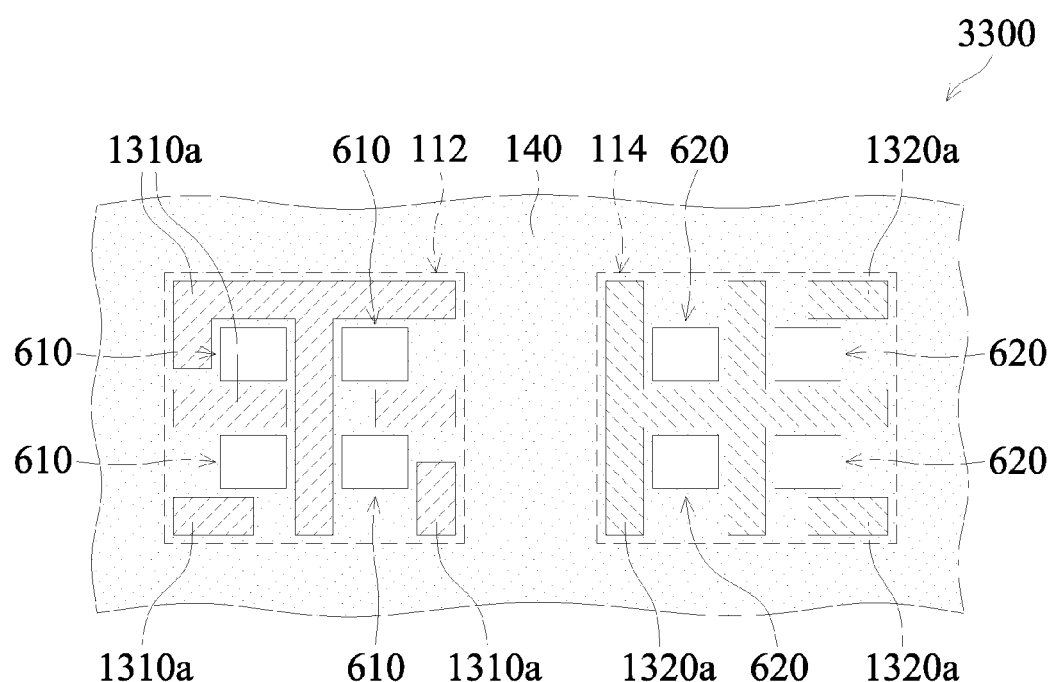
FIG. 37 is a top view of a semiconductor device structure, in accordance with some embodiments.

FIG. 37 is a top view of a semiconductor device structure 3700, in accordance with some embodiments. In some embodiments, as shown in FIG. 37, a semiconductor device structure 3700 is similar to the semiconductor device structure 1700 of FIG. 17, except that the first pillar structures 1310*a* and the second pillar structures 1320*a* of the semiconductor device structure 3700 are arranged irregularly. In some embodiments, the first pillar structures 1310*a* have shapes that are different from each other. In some embodiments, the second pillar structures 1320*a* have different shapes. In some embodiments, the first pillar structures 1310*a* have shapes that are different from those of the second pillar structures 1320*a*.

In accordance with some embodiments, semiconductor device structures and methods for forming the same are provided. The semiconductor device structure has annular structures with different thermal diffusion coefficients and/or pillar structures with different thermal diffusion coefficients. After an annealing process, in the semiconductor device structure, devices (such as transistors or resistors) surrounded by the annular structures (and/or the pillar structures) with different thermal diffusion coefficients may have different threshold voltages or resistance to achieve different functions.

In accordance with some embodiments, a semiconductor device structure is provided. The semiconductor device structure includes a semiconductor substrate having a first device region and a second device region. The semiconductor device structure further includes first devices in the first device region and second devices in the second device region. The semiconductor device structure also includes a first annular structure continuously surrounding the first device region and a second annular structure continuously surrounding the second device region. The first annular structure has a first thermal diffusion coefficient less than a second thermal diffusion coefficient of the second annular structure.

In accordance with some embodiments, a semiconductor device structure is provided. The semiconductor device structure includes a semiconductor substrate having a first device region and a second device region. The semiconductor device structure further includes first devices in the first device region and second devices in the second device region. The semiconductor device structure also includes first pillar structures in the first device region and surrounding the first devices and second pillar structures in the second device region and surrounding the second devices. The first pillar structures have a first thermal diffusion coefficient less than a second thermal diffusion coefficient of the second pillar structures.

In accordance with some embodiments, a method for forming a semiconductor device structure is provided. The method includes providing a semiconductor substrate having a first device region and a second device region. The method further includes forming a first layer on the semiconductor substrate. The method also includes forming a second layer on the semiconductor substrate. The first layer has a first thermal diffusion coefficient less than a second thermal diffusion coefficient of the second layer. The method includes forming first devices in the first device region and second devices in the second device region. The first layer surrounds the first devices, and the second layer surrounds the second devices. The method includes performing an annealing process on the semiconductor substrate.

Although the embodiments and their advantages have been described in detail, it should be understood that various changes, substitutions, and alterations can be made herein without departing from the spirit and scope of the embodiments as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A semiconductor device structure, comprising:
a semiconductor substrate having a first device region and a second device region;
a plurality of first devices in the first device region;
a plurality of second devices in the second device region;
a first annular structure continuously surrounding the first device region; and
a second annular structure continuously surrounding the second device region, wherein the first annular structure has a first thermal diffusion coefficient less than a second thermal diffusion coefficient of the second annular structure.

2. The semiconductor device structure as claimed in claim 1, wherein the first devices comprise first transistors, and the second devices comprise second transistors, wherein each of the first transistors has a threshold voltage less than that of each of the second transistors.

3. The semiconductor device structure as claimed in claim 1, wherein the first devices comprise first resistors, and the second devices comprise second resistors, wherein a resistance of each of the first resistors is less than that of each of the second resistors.

4. The semiconductor device structure as claimed in claim 1, wherein the first annular structure comprises semiconductor oxide or semiconductor nitride.

5. The semiconductor device structure as claimed in claim 4, wherein the first annular structure comprises silicon oxide or silicon nitride.

6. The semiconductor device structure as claimed in claim 1, wherein the second annular structure comprises semiconductor or metal.

7. The semiconductor device structure as claimed in claim 6, wherein the second annular structure comprises silicon, silicon germanium, copper, gold, silver, or aluminum.

8. The semiconductor device structure as claimed in claim 1, wherein the first annular structure and the second annular structure each have a width ranging from about 15 μm to about 150 μm.

9. The semiconductor device structure as claimed in claim 1, wherein a ratio of a first width of the first annular structure to a second width of the first device region ranges from about 0.15 to about 1.5.

10. A semiconductor device structure, comprising:
    a semiconductor substrate having a first device region and a second device region;
    a plurality of first devices in the first device region;
    a plurality of second devices in the second device region;
    a plurality of first pillar structures in the first device region and surrounding the first devices; and
    a plurality of second pillar structures in the second device region and surrounding the second devices, wherein the first pillar structures have a first thermal diffusion coefficient less than a second thermal diffusion coefficient of the second pillar structures.

11. The semiconductor device structure as claimed in claim 10, wherein the first devices comprise first transistors, and the second devices comprise second transistors, wherein each of the first transistors has a threshold voltage less than that of each of the second transistors.

12. The semiconductor device structure as claimed in claim 10, wherein the first devices comprise first resistors, and the second devices comprise second resistors, wherein a resistance of each of the first resistors is less than that of each of the second resistors.

13. The semiconductor device structure as claimed in claim 10, wherein the first pillar structures comprise semiconductor oxide or semiconductor nitride.

14. The semiconductor device structure as claimed in claim 10, wherein the second pillar structures comprise semiconductor or metal.

15. The semiconductor device structure as claimed in claim 10, wherein at least one of the first pillar structures is located between the first devices, and at least one of the second pillar structures is located between the second devices.

16. The semiconductor device structure as claimed in claim 10, wherein each of the first pillar structures and the second pillar structures has a width ranging from about 15 μm to about 150 μm.

17. The semiconductor device structure as claimed in claim 10, further comprising:
    a first annular structure continuously surrounding the first device region; and
    a second annular structure continuously surrounding the second device region, wherein the first annular structure has a third thermal diffusion coefficient less than a fourth thermal diffusion coefficient of the second annular structure.

18. A method for forming a semiconductor device structure, comprising:
    providing a semiconductor substrate having a first device region and a second device region;
    forming a first layer on the semiconductor substrate;
    forming a second layer on the semiconductor substrate, wherein the first layer has a first thermal diffusion coefficient less than a second thermal diffusion coefficient of the second layer;
    forming a plurality of first devices in the first device region and a plurality of second devices in the second device region, wherein the first layer surrounds the first devices, and the second layer surrounds the second devices; and
    performing an annealing process on the semiconductor substrate.

19. The method for forming a semiconductor device structure as claimed in claim 18, wherein the forming of the first layer comprises:
    forming a first annular structure continuously surrounding the first device region,
    wherein the forming of the second layer comprises:
    forming a second annular structure continuously surrounding the second device region.

20. The method for forming a semiconductor device structure as claimed in claim 18, wherein the forming of the first layer comprises:
    forming a plurality of first pillar structures in the first device region and surrounding the first devices,
    wherein the forming of the second layer comprises:
    forming a plurality of second pillar structures in the second device region and surrounding the second devices.

\* \* \* \* \*